US012660457B2

(12) United States Patent
Lee et al.

(10) Patent No.: US 12,660,457 B2
(45) Date of Patent: Jun. 16, 2026

(54) DISPLAY DEVICE INCLUDING SENSORS

(71) Applicant: SAMSUNG DISPLAY CO., LTD.,
Yongin-si (KR)

(72) Inventors: Cheol-Gon Lee, Suwon-si (KR);
Heejean Park, Suwon-si (KR); Heerim Song, Seoul (KR); Yujin Lee,
Yeongtong-gu (KR); Mukyung Jeon,
Ulsan (KR)

(73) Assignee: SAMSUNG DISPLAY CO., LTD.,
Yongin-si (KR)

( * ) Notice: Subject to any disclaimer, the term of this patent is extended or adjusted under 35 U.S.C. 154(b) by 600 days.

(21) Appl. No.: 18/172,260

(22) Filed: Feb. 21, 2023

(65) Prior Publication Data

US 2023/0320161 A1     Oct. 5, 2023

(30) Foreign Application Priority Data

Apr. 4, 2022     (KR) ........................ 10-2022-0041762

(51) Int. Cl.
H10K 59/35        (2023.01)
G06V 40/13        (2022.01)
        (Continued)

(52) U.S. Cl.
CPC ....... H10K 59/352 (2023.02); G06V 40/1318
(2022.01); H10K 39/34 (2023.02);
        (Continued)

(58) Field of Classification Search
CPC ...... H10K 59/13; H10K 59/353; H10K 59/40;
H10K 59/50; H10K 59/60; H10K 59/65;

H10K 59/80515; H10K 39/34; H10K
59/1213; H10K 59/351; H10K 50/813;
H10K 59/131; H10K 59/352; G06V
40/1318; G06V 40/1306; G09G 3/3233;
G09G 2300/0819; G09G 2300/0842;
(Continued)

(56) References Cited

U.S. PATENT DOCUMENTS 8,749,496 B2     6/2014 Chang et al.
9,250,735 B2     2/2016 Kim et al.
        (Continued)

FOREIGN PATENT DOCUMENTS

KR     10-2019-0081730     7/2019
KR     10-2021-0064483     6/2021

*Primary Examiner* — Eduardo A Rodela
(74) *Attorney, Agent, or Firm* — F. CHAU & ASSOCIATES, LLC

(57) ABSTRACT

A display device includes a base layer, and a pixel layer including a reference pixel unit and sensor. The reference pixel unit includes first and second light emitting elements emitting a first color light. The sensor includes a light detection element disposed corresponding to the reference pixel unit, and a sensor driving circuit electrically connected to the light detection element. Each of the first and second light emitting elements includes an anode electrode, and a light emitting layer. The light emitting layer of the first light emitting element has the same size as the light emitting layer of the second light emitting element, and the anode electrode of the first light emitting element has a size that is different from that of the anode electrode of the second light emitting element.

27 Claims, 20 Drawing Sheets

(51) Int. Cl.

| | |
|---|---|
| *H10K 39/34* | (2023.01) |
| *H10K 59/121* | (2023.01) |
| *H10K 59/80* | (2023.01) |
| *G09G 3/3233* | (2016.01) |

(52) U.S. Cl.
CPC ....... *H10K 59/1213* (2023.02); *H10K 59/353* (2023.02); *H10K 59/8051* (2023.02); *H10K 59/80515* (2023.02); *G09G 3/3233* (2013.01); *G09G 2300/0819* (2013.01); *G09G 2300/0842* (2013.01); *G09G 2300/0861* (2013.01); *G09G 2310/08* (2013.01); *G09G 2354/00* (2013.01); *G09G 2360/14* (2013.01); *H10K 59/351* (2023.02)

(58) Field of Classification Search
CPC ....... G09G 2300/0861; G09G 2310/08; G09G 2354/00; G09G 2360/14; G09F 9/335
See application file for complete search history.

(56) References Cited

U.S. PATENT DOCUMENTS

| | | | |
|---|---|---|---|
| 11,158,258 B2 | 10/2021 | Cha et al. | |
| 12,087,082 B2 * | 9/2024 | Song ..................... | H10K 39/34 |

* cited by examiner

Figure 3:
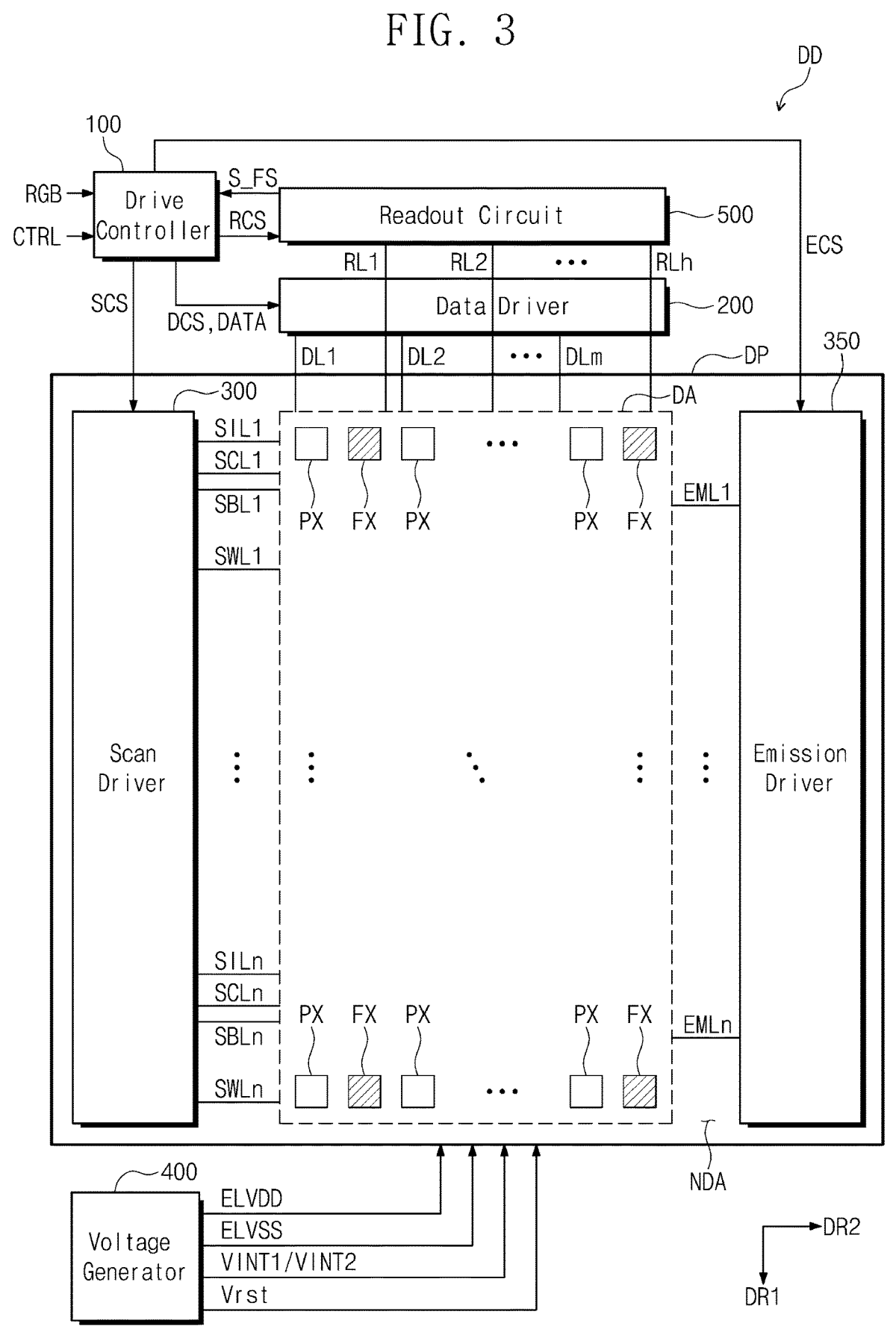

RGB → Drive Controller
CTRL →

S_FS

RCS

Readout Circuit — 500

RL1     RL2     · · ·     RLh

SCS

DCS,DATA

Data Driver — 200

DL1     DL2     · · ·     DLm

DP

350

ECS

300

DA

Scan Driver

SIL1
SCL1
SBL1
SWL1

PX  FX  PX   · · ·   PX  FX

EML1

Emission Driver

SILn
SCLn
SBLn
SWLn

PX  FX  PX   · · ·   PX  FX

EMLn

NDA

400

Voltage Generator

ELVDD
ELVSS
VINT1/VINT2
Vrst

DISPLAY DEVICE INCLUDING SENSORS

CROSS-REFERENCE TO RELATED APPLICATIONS

This U.S. non-provisional patent application claims priority under 35 U.S.C. § 119 to Korean Patent Application No. 10-2022-0041762, filed on Apr. 4, 2022, the entire contents of which are hereby incorporated by reference.

TECHNICAL FIELD

The present disclosure relates to a display device, and more particularly, to a display device including reference pixels.

DISCUSSION OF THE RELATED ART

Display device provides various functions that enable a user to see information displayed thereon. Some display devices further provide a natural way of sensing touch input. For example, display devices may be configured to display an image to a user and sensing a user's input. Recent display devices include a function for detecting user's biometric information such as recognizing a fingerprint.

The biometric information recognition method includes a capacitive method for detecting a change in capacitance formed between electrodes, an optical method for detecting incident light using an optical sensor, and an ultrasonic method for sensing vibration using a piezoelectric material.

SUMMARY

A display device includes a base layer and a pixel layer disposed on the base layer and including a plurality of reference pixel units and a plurality of sensors. Each of the plurality of reference pixel units includes first and second light emitting elements emitting a first color light. Each of the plurality of sensors includes at least one light detection element disposed to correspond to one of the reference pixel units, and a sensor driving circuit electrically connected to the light detection element. Each of the first and second light emitting elements includes an anode electrode and a light emitting layer disposed on the anode electrode. The light emitting layer of the first light emitting element has a same size as the light emitting layer of the second light emitting element, and the anode electrode of the first light emitting element has a size that is different from that of the anode electrode of the second light emitting element.

A display device includes a base layer and a pixel layer disposed on the base layer and including a plurality of pixels and a plurality of sensors. Each of the plurality of sensors includes k light detection elements electrically connected to each other, and a sensor driving circuit electrically connected to one of the k light detection elements. A first light emitting element at least partially overlapping the sensor driving circuit, among the plurality of pixels, includes a first anode electrode. Among the plurality of pixels, a second light emitting element that does not overlap the sensor driving circuit and outputs the same color light as the first light emitting element includes a second anode electrode. The first anode electrode has a shape that is different from that of the second anode electrode.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 3 is a block diagram of a display device according to an embodiment;

FIG. 7 is an enlarged view of a partial area BB1 of the display panel shown in FIG. 4A according to an embodiment;

FIG. 9 is an enlarged view of a partial area BB1 of the display panel shown in FIG. 4A according to an embodiment;

FIG. 12B is an enlarged view of a partial area CC1 of the display panel shown in FIG. 11A according to an embodiment;

FIG. 13 is a cross-sectional view illustrating a pixel of a display panel according to an embodiment.

DETAILED DESCRIPTION

Figure 1:
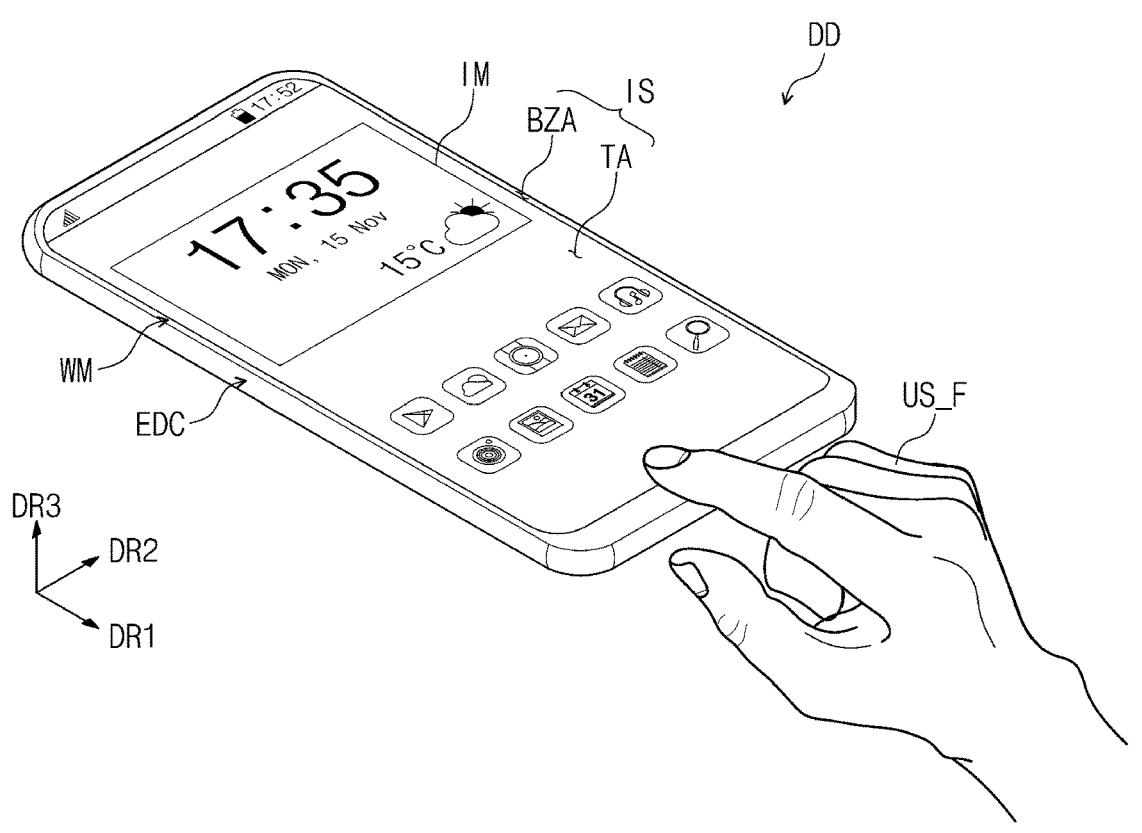
FIG. 1 is a perspective view of a display device according to an embodiment.

In this specification, when an element (or region, layer, part, etc.) is referred to as being "on", "connected to", or "coupled to" another element, it means that it may be directly placed on/connected to/coupled to other components, or a third component may be arranged between them.

Like reference numerals may refer to like elements throughout the specification and the drawings. "And/or" includes all of one or more combinations defined by related components.

It will be understood that the terms "first" and "second" are used herein to describe various components but these components should not necessarily be limited by these terms. The above terms are used to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of components shown in the drawing. The terms are described as a relative concept based on a direction shown in the drawing.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the inventive concept will be described with reference to the drawings.

Figure 2:
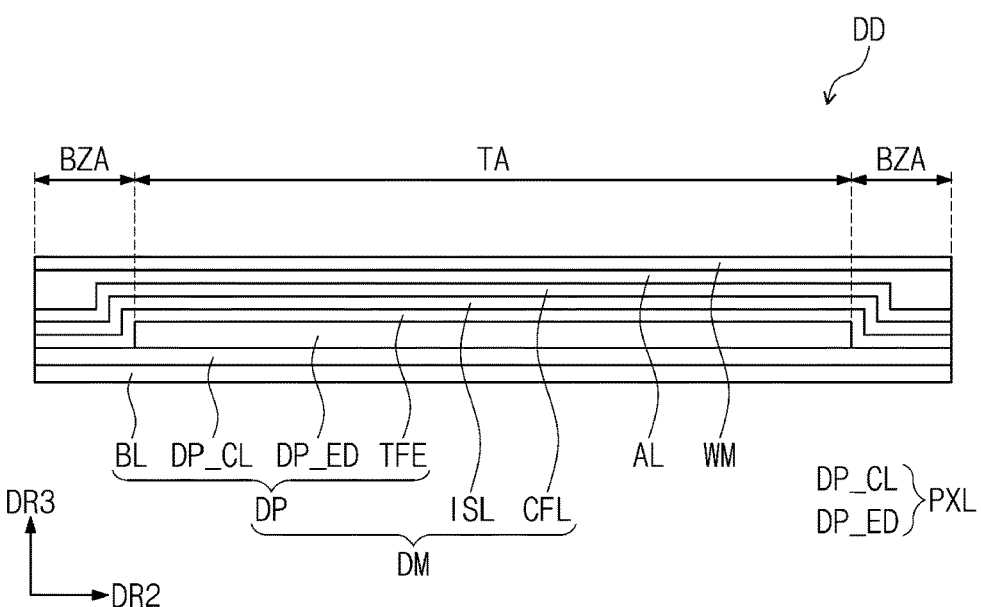
FIG. 2 is a cross-sectional view of a display device according to an embodiment.

FIG. 1 is a perspective view of a display device according to an embodiment, and FIG. 2 is a cross-sectional view of a display device according to an embodiment.

Referring to FIGS. 1 and 2, a display device DD, according to an embodiment of the inventive concept, may have a substantially rectangular shape having a pair of long sides extending in the first direction DR1 and a pair of short sides extending in the second direction DR2 intersecting the first direction DR1. However, the inventive concept is not necessarily limited thereto, and the display device DD may have various shapes such as a circle or a polygon.

The display device DD may be a device that is activated according to an electrical signal. The display device DD may include various embodiments. For example, the display device DD may be applied to electronic devices such as a smart watch, a tablet, a notebook computer, a smart television, and the like.

Hereinafter, a normal direction substantially perpendicular to a plane defined by the first direction DR1 and the second direction DR2 is defined as the third direction DR3. In this specification, the meaning of "in a plan view" may mean a state viewed from the third direction DR3.

The upper surface of the display device DD may be defined as the display surface IS and may be parallel to a plane defined by the first direction DR1 and the second direction DR2. The images IM generated by the display device DD may be provided to the user through the display surface IS.

The display surface IS may be divided into a transmission area TA and a bezel area BZA. The transmission area TA may be an area in which images IM are displayed. The user recognizes the images IM through the transmission area TA. In this embodiment, the transmission area TA is illustrated in a rectangular shape with rounded vertices. However, this is illustrated by way of example, and the transmission area TA may have various shapes, and is not necessarily limited to any one embodiment.

The bezel area BZA is adjacent to the transmission area TA. The bezel area BZA may have a predetermined color. The bezel area BZA may at least partially surround the transmission area TA. Accordingly, the shape of the transmission area TA may be substantially defined by the bezel area BZA. However, this is illustrated as an example, and the bezel area BZA may be disposed adjacent to only one side of the transmission area TA, or may be omitted.

The display device DD may sense an external input. The external input may include various types of inputs provided from the outside of the display device DD. For example, the external input may include a contact by a part of the body, such as the user's hand US_F, or a contact by a separate device (e.g., an active pen or a digitizer), and also include an external input (e.g., hovering) applied adjacent to the display device DD or by a predetermined distance. In addition, the external input may have various forms such as force, pressure, temperature, light, and the like.

The display device DD may detect the user's biometric information. A biometric information detection area capable of detecting the user's biometric information may be provided on the display surface IS of the display device DD. The biometric information detection area may be provided in the entire area of the transmission area TA or may be provided in one or more partial areas of the transmission area TA. FIG. 1 illustrates that the entire transmission area TA is utilized as a biometric information detection area as an example of the inventive concept.

The display device DD may include a window WM, a display module DM, and a housing EDC. In the present embodiment, the window WM and the housing EDC are combined to form an exterior of the display device DD.

The front surface of the window WM defines the display surface IS of the display device DD. The window WM may include an optically transparent insulating material. For example, the window WM may include glass or plastic. The window WM may have a multilayer structure or a single layer structure. For example, the window WM may include a plurality of plastic films bonded with an adhesive, or may include a glass substrate and a plastic film bonded with an adhesive.

The display module DM may include a display panel DP and an input detection layer ISL. The display panel DP may display an image according to an electrical signal, and the input detection layer ISL may detect an external input. The external input may be provided in various forms.

The display panel DP, according to an embodiment of the inventive concept, may be a light emitting display panel, but is not particularly limited thereto. For example, the display panel DP may be an organic light emitting display panel, an inorganic light emitting display panel, or a quantum dot light emitting display panel. The light emitting layer of the organic light emitting display panel may include an organic light emitting material, and the light emitting layer of the inorganic light emitting display panel may include an inorganic light emitting material. The light emitting layer of the quantum dot light emitting display panel may include a quantum dot and a quantum rod. Hereinafter, the display panel DP is described as the organic light emitting display panel.

Referring to FIG. 2, the display panel DP includes a base layer BL, a pixel layer PXL, and an encapsulation layer TFE. The display panel DP according to the inventive concept may be a flexible display panel, which is a display panel that may be flexed to a noticeable degree without cracking or sustaining other forms of damage. However, the inventive concept is not necessarily limited thereto. For example, the display panel DP may be a foldable display panel or a rigid display panel that is folded based on a folding axis.

The base layer BL may include a synthetic resin layer. The synthetic resin layer may be a polyimide resin layer, and the material thereof is not particularly limited thereto. In addition, the base layer BL may include a glass substrate, a metal substrate, or an organic/inorganic composite material substrate.

The pixel layer PXL is disposed on the base layer BL. The pixel layer PXL may include a circuit layer DP_CL and an element layer DP_ED. The circuit layer DP_CL is disposed between the base layer BL and the element layer DP_ED. The circuit layer DP_CL includes at least one insulating layer and a circuit element. Hereinafter, the insulating layer included in the circuit layer DP_CL is referred to as an intermediate insulating layer. The intermediate insulating layer includes at least one intermediate inorganic layer and at least one intermediate organic layer. The circuit element may include a pixel driving circuit included in each of the plurality of pixels for displaying an image and a sensor driving circuit included in each of the plurality of sensors for recognizing external information. The external information may be biometric information. As an example of the inventive concept, the sensor may be a fingerprint recognition sensor, a proximity sensor, an iris recognition sensor, or the like. Also, the sensor may be an optical sensor that recognizes biometric information in an optical manner. The circuit layer DP_CL may further include signal lines electrically connected to the pixel driving circuit and/or the sensor driving circuit.

The element layer DP_ED may include a light emitting element included in each of the pixels and a light detection element included in each of the sensors. As an example of the inventive concept, the light detection element may be a photodiode. The light detection element may be a sensor that senses or responds to light reflected by a user's fingerprint. The circuit layer DP_CL and the element layer DP_ED will be described in detail later with reference to FIGS. 13, 14A, and 14B.

The encapsulation layer TFE encapsulates the element layer DP_ED. The encapsulation layer TFE may include at least one organic layer and at least one inorganic layer. The inorganic layer may include an inorganic material and may protect the element layer DP_ED from moisture/oxygen. The inorganic film may include a silicon nitride layer, a silicon oxynitride layer, a silicon oxide layer, a titanium oxide layer, or an aluminum oxide layer, but is not particularly limited thereto. The organic layer may include an organic material, and may protect the element layer DP_ED from foreign substances such as dust particles.

An input detection layer ISL may be formed on the display panel DP. The input detection layer ISL may be directly disposed on the encapsulation layer TFE. According to an embodiment of the inventive concept, the input detection layer ISL may be formed on the display panel DP by a continuous process. For example, when the input detection layer ISL is directly disposed on the display panel DP, the adhesive film is not disposed between the input detection layer ISL and the encapsulation layer TFE. Alternatively, an adhesive film may be disposed between the input detection layer ISL and the display panel DP. In this case, the input detection layer ISL is not manufactured by a continuous process with the display panel DP, and after being manufactured through a process separate from that of the display panel DP, the input detection layer ISL may be fixed to the upper surface of the display panel DP by an adhesive film.

The input detection layer ISL may detect an external input (for example, a user's touch), change the detected external input into a predetermined input signal, and provide the input signal to the display panel DP. The input detection layer ISL may include a plurality of detection electrodes for detecting the external input. The detection electrodes may detect an external input in a capacitive manner. The display panel DP may receive an input signal from the input detection layer ISL and generate an image corresponding to the input signal.

The display module DM may further include a color filter layer CFL. As an example of the inventive concept, the color filter layer CFL may be disposed on the input detection layer ISL. However, the inventive concept is not necessarily limited thereto. The color filter layer CFL may be disposed between the display panel DP and the input detection layer ISL. The color filter layer CFL may include a plurality of color filters and a black matrix.

Details regarding the structures of the input detection layer ISL and the color filter layer CFL are described below.

The display device DD, according to an embodiment, may further include an adhesive layer AL. The window WM may be attached to the input detection layer ISL by the adhesive layer AL. The adhesive layer AL may include an optical clear adhesive, an optically clear adhesive resin, or a pressure sensitive adhesive (PSA).

The housing EDC is coupled to the window WM. The housing EDC is coupled to the window WM to define a predetermined internal space therebetween. The display module DM may be accommodated in the internal space. The housing EDC may include a material having relatively high rigidity. For example, the housing EDC may include a plurality of frames and/or plates made of glass, plastic, or metal, or a combination thereof. The housing EDC may stably protect components of the display device DD accommodated in the internal space from external impact. A battery module for supplying power required for the overall operation of the display device DD may be disposed between the display module DM and the housing EDC.

FIG. 3 is a block diagram of a display device according to an embodiment.

Referring to FIG. 3, the display device DD includes a display panel DP, a panel driver, and a driving controller 100. As an example of the inventive concept, the panel driver includes a data driver 200, a scan driver 300, an emission driver 350, a voltage generator 400, and a readout circuit 500.

The driving controller 100 receives image signals RGB and control signals CTRL. The driving controller 100 generates image data DATA by converting data formats of the image signals RGB to meet the specification of an interface with the data driver 200. The driving controller 100 outputs a first control signal SCS, a second control signal ECS, a third control signal DCS, and a fourth control signal RCS.

The data driver 200 receives the third control signal DCS and the image data DATA from the driving controller 100. The data driver 200 converts the image data DATA into data signals, and outputs the data signals to a plurality of data lines DL1 to DLm, which are described below. The data signals are analog voltages corresponding to the grayscale values of the image data DATA.

The scan driver 300 receives the first control signal SCS from the driving controller 100. The scan driver 300 may output scan signals to scan lines in response to the first control signal SCS.

The voltage generator 400 generates voltages necessary for the operation of the display panel DP. In this embodiment, the voltage generator 400 generates a first driving voltage ELVDD, a second driving voltage ELVSS, a first initialization voltage VINT1, and a second initialization voltage VINT2.

The display panel DP includes a display area DA corresponding to the transmission area TA (shown in FIG. 1) and a non-display area NDA corresponding to the bezel area BZA (shown in FIG. 1).

The display panel DP may include a plurality of pixels PX disposed in the display area DA and a plurality of sensors FX disposed in the display area DA. As an example of the inventive concept, each of the plurality of sensors FX may be disposed between two pixels PX adjacent to each other. The plurality of pixels PX and the plurality of sensors FX may be alternately disposed in the first and second directions DR1 and DR2. However, the inventive concept is not necessarily limited thereto. For example, two or more pixels PX are disposed between two sensors FX adjacent to each other in the first direction DR1 among the plurality of sensors FX, and two or more pixels PX may be disposed between two sensors FX adjacent to each other in the second direction DR2 among the plurality of sensors FX.

The display panel DP further includes initialization scan lines SIL1 to SILn, compensation scan lines SCL1 to SCLn, write scan lines SWL1 to SWLn, black scan lines SBL1 to SBLn, emission control lines EML1 to EMLn, data lines DL1 to DLm, and readout lines RL1 to RLh. The initialization scan lines SIL1 to SILn, the compensation scan lines SCL1 to SCLn, the write scan lines SWL1 to SWLn, the black scan lines SBL1 to SBLn, and the emission control lines EML1 to EMLn extend in the second direction DR2. The initialization scan lines SIL1 to SILn, the compensation scan lines SCL1 to SCLn, the write scan lines SWL1 to SWLn, the black scan lines SBL1 to SBLn, and the emission control lines EML1 to EMLn are spaced apart from each other in the first direction DR1. The data lines DL1 to DLm and the readout lines RL1 to RLh extend in the first direction DR1 and are spaced apart from each other in the second direction DR2.

The plurality of pixels PX are electrically connected to the initialization scan lines SIL1 to SILn, the compensation scan lines SCL1 to SCLn, the write scan lines SWL1 to SWLn, the black scan lines SBL1 to SBLn, the emission control lines EML1 to EMLn, and the data lines DL1 to DLm, respectively. For example, each of the plurality of pixels PX may be electrically connected to four scan lines. However, the number of scan lines electrically connected to each pixel PX is not necessarily limited thereto and may be changed.

The plurality of sensors FX are electrically connected to the write scan lines SWL1 to SWLn and the readout lines RL1 to RLh, respectively. Each of the plurality of sensors FX may be electrically connected to one scan line. However, the inventive concept is not necessarily limited thereto. The number of scan lines electrically connected to each sensor FX may vary. As an example of the inventive concept, the number of readout lines RL1 to RLh may correspond to ½ of the number of data lines DL1 to DLm. However, the inventive concept is not necessarily limited thereto. Alternatively, the number of readout lines RL1 to RLh may correspond to ¼ or ⅛ of the number of data lines DL1 to DLm.

The scan driver 300 may be disposed in the non-display area NDA of the display panel DP. The scan driver 300 receives the first control signal SCS from the driving controller 100. The scan driver 300 outputs initialization scan signals to the initialization scan lines SIL1 to SILn in response to the first control signal SCS, and outputs compensation scan signals to the compensation scan lines SCL1 to SCLn. Also, the scan driver 300 may output write scan signals to the write scan lines SWL1 to SWLn in response to the first control signal SCS, and output black scan signals to the black scan lines SBL1 to SBLn. Alternatively, the scan driver 300 may include first and second scan drivers. The first scan driver may output the initialization scan signals and the compensation scan signals, and the second scan driver may output the write scan signals and the black scan signals.

The emission driver 350 may be disposed in the non-display area NDA of the display panel DP. The emission driver 350 receives the second control signal ECS from the driving controller 100. The emission driver 350 may output emission control signals to the emission control lines EML1 to EMLn in response to the second control signal ECS. Alternatively, the scan driver 300 may be electrically connected to the emission control lines EML1 to EMLn. In this case, the emission driver 350 may be omitted, and the scan driver 300 may output the emission control signals to the emission control lines EML1 to EMLn.

The readout circuit 500 receives the fourth control signal RCS from the driving controller 100. The readout circuit 500 may receive detection signals from the readout lines RL1 to RLh in response to the fourth control signal RCS. The readout circuit 500 may process the detection signals received from the readout lines RL1 to RLh and provide the processed detection signals S_FS to the driving controller 100. The driving controller 100 may recognize biometric information based on the processed detection signals S_FS.

Figure 4A:
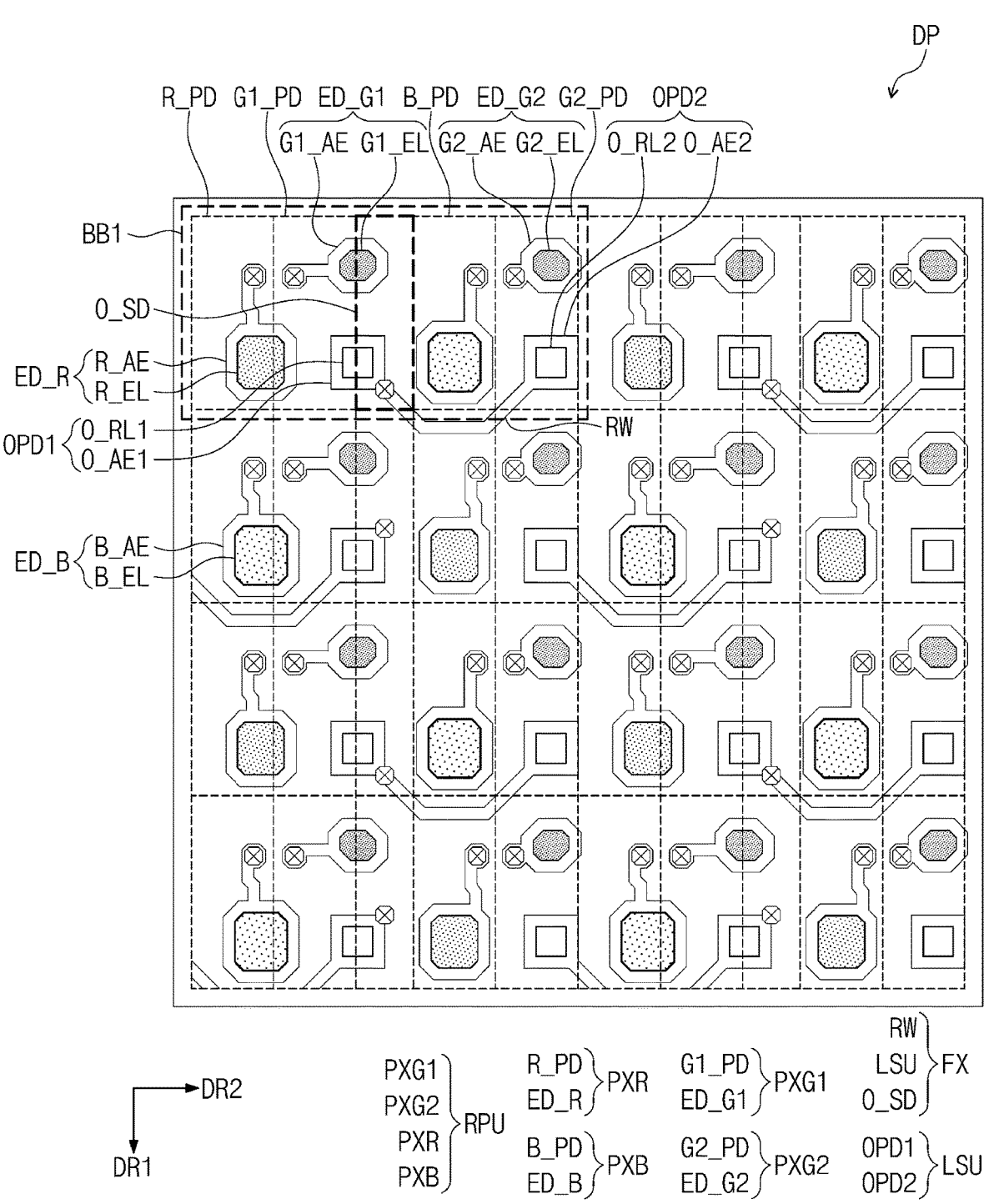
FIGS. 4A and 4B are enlarged plan views of some areas of a display panel according to example embodiments.
Figure 4B:
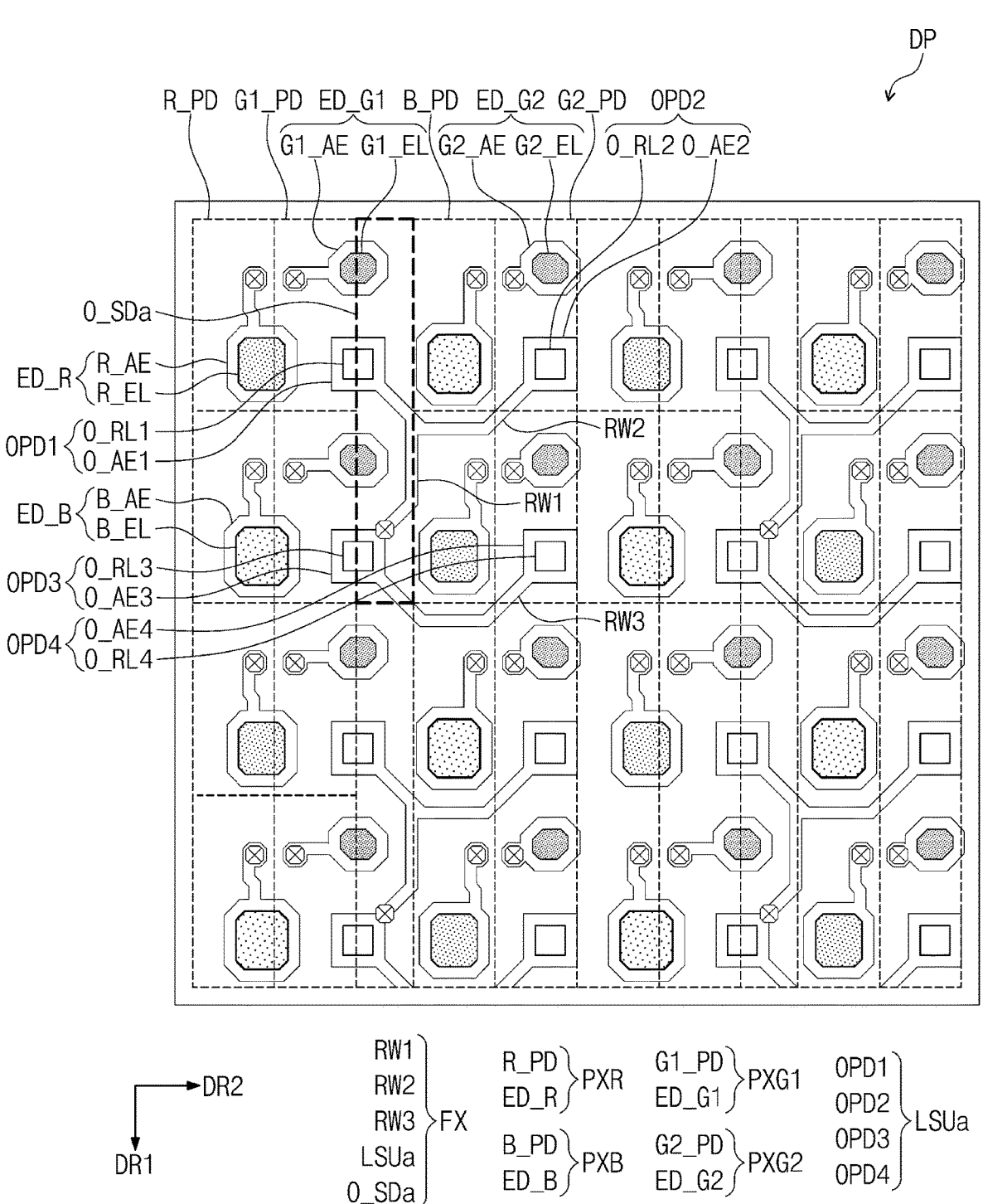

FIGS. 4A and 4B are enlarged plan views of some areas of a display panel according to example embodiments.

Referring to FIG. 4A, the display panel DP includes a plurality of pixels PXR, PXG1, PXG2, and PXB and a plurality of sensors FX.

The plurality of pixels PXR, PXG1, PXG2, and PXB may be grouped into a plurality of reference pixel units RPU. As an example of the inventive concept, each reference pixel unit RPU may include four pixels, two first pixels PXG1 and PXG2 (hereinafter, first and second green pixels), a third pixel PXR (hereinafter, a red pixel), and a fourth pixel PXB (hereinafter, a blue pixel). However, the number of pixels included in each reference pixel unit RPU is not necessarily limited thereto. Alternatively, each reference pixel unit RPU may include three pixels, for example, the first green pixel PXG1 (or the second green pixel PXG2), the red pixel PXR, and the blue pixel PXB.

The first and second green pixels PXG1 and PXG2 include first and second light emitting elements ED_G1 and ED_G2 (hereinafter, first and second green light emitting elements), respectively, the red pixel PXR includes a third light emitting element ED_R (hereinafter, a red light emitting element), and the blue pixel PXB includes a fourth light emitting element ED_B (hereinafter, a blue light emitting element). As an example of the inventive concept, each of the first and second green light emitting elements ED_G1 and ED_G2 outputs a first color light (e.g., green light), the red light emitting element ED_R outputs a second color light (e.g., red light) different from the first color light, and the blue light emitting element ED_B outputs a third color light (e.g., blue light) different from the first and second color lights. The green light output from the first green light emitting element ED_G1 may have the same wavelength band as the green light output from the second green light emitting element ED_G2.

In the first and second directions DR1 and DR2, the red light emitting elements ED_R and the blue light emitting elements ED_B may be alternately and repeatedly disposed. The first and second green light emitting elements ED_G1 and ED_G2 are alternately and repeatedly arranged in the first direction DR1, and are alternately and repeatedly disposed in the second direction DR2. The first and second green light emitting elements ED_G1 and ED_G2 may be disposed in different rows and different columns from the red light emitting elements ED_R and blue light emitting elements ED_B in the first and second directions DR1 and DR2.

As an example of the inventive concept, the red light emitting element ED_R may have a larger size than the first and second green light emitting elements ED_G1 and ED_G2. In addition, the blue light emitting element ED_B may have a size greater than or equal to that of the red light emitting element ED_R. The size of each of the light emitting elements ED_R, ED_G1, ED_G2, and ED_B is not necessarily limited thereto, and may be variously modified and applied. For example, in another embodiment of the inventive concept, the light emitting elements ED_R, ED_G1, ED_G2, and ED_B may have the same size.

The first and second green light emitting elements ED_G1 and ED_G2 may have different shapes from the red and blue light emitting elements ED_R and ED_B. As an example of the inventive concept, each of the red and blue light emitting elements ED_R and ED_B may have an octagonal shape longer in the first direction DR1 than in the second direction DR2. The red and blue light emitting elements ED_R and ED_B may have the same size or different sizes, but have the same shape. The shape of each of the red and blue light emitting elements ED_R and ED_B is not necessarily limited thereto. For example, each of the red and blue light emitting elements ED_R and ED_B may have an octagonal shape having the same length in the first direction DR1 and the second direction DR2, and may also have one of a square and rectangular shape.

Each of the first and second green light emitting elements ED_G1 and ED_G2 may have an octagonal shape having a length longer in the second direction DR2 than the first direction DR1. As an example of the inventive concept, the first and second green light emitting elements ED_G1 and ED_G2 have the same size and the same shape. However, shapes of the first and second green light emitting elements ED_G1 and ED_G2 are not necessarily limited thereto. Each of the first and second green light emitting elements ED_G1 and ED_G2 may have an octagonal shape having the same length in the first direction DR1 and the second direction DR2, or have one of a square shape and a rectangular shape.

The first green light emitting element ED_G1 is electrically connected to a first green pixel driving circuit G1_PD. For example, the first green light emitting element ED_G1 includes a first green anode electrode G1_AE and a first green light emitting layer G1_EL, and the first green anode electrode G1_AE is electrically connected to the first green pixel driving circuit G1_PD through a contact hole. The second green light emitting element ED_G2 is electrically connected to a second green pixel driving circuit G2_PD. For example, the second green light emitting element ED_G2 includes a second green anode electrode G2_AE and a second green light emitting layer G2_EL, and the second green anode electrode G2_AE is electrically connected to the second green pixel driving circuit G2_PD through a contact hole.

The first green light emitting layer G1_EL and the second green light emitting layer G2_EL may have the same size. The first green light emitting layer G1_EL and the second green light emitting layer G2_EL may have the same shape or different shapes. As an example of the inventive concept, the first green light emitting layer G1_EL and the second green light emitting layer G2_EL have different shapes on the same plane. The first green anode electrode G1_AE and the second green anode electrode G2_AE may have different sizes and different shapes.

The red light emitting element ED_R is electrically connected to a red pixel driving circuit R_PD. For example, the red light emitting element ED_R includes a red anode electrode R_AE and a red light emitting layer R_EL, and the red anode electrode R_AE is electrically connected to the red pixel driving circuit R_PD through a contact hole. The blue light emitting element ED_B is electrically connected to a blue pixel driving circuit B_PD. For example, the blue light emitting element ED_B includes a blue anode electrode B_AE and a blue light emitting layer B_EL, and the blue anode electrode B_AE is electrically connected to the blue pixel driving circuit B_PD through a contact hole.

Each of the sensors FX includes a light detection unit LSU and a sensor driving circuit O_SD. The light detection unit LSU may include at least one light detection element. As an example of the inventive concept, the light detection unit LSU includes k light detection elements, and one of the k light detection elements is electrically connected to the sensor driving circuit O_SD. Here, k may be an integer of 2 or more. FIG. 4A illustrates a case where k is 2. When k is 2, the light detection unit LSU includes two light detection elements (hereinafter, referred to as first and second light detection elements OPD1 and OPD2). As an example of the inventive concept, two light detection elements (i.e., first and second light detection elements OPD1 and OPD2) may be disposed to correspond to one reference pixel unit RPU. However, the number of light detection elements disposed to correspond to each reference pixel unit RPU is not necessarily limited thereto. For example, one light detection element may be disposed to correspond to each reference pixel unit RPU.

Each of the first and second light detection elements OPD1 and OPD2 is disposed between the red and blue light emitting elements ED_R and ED_B in the second direction DR2. Each of the first and second light detection elements OPD1 and OPD2 may be disposed adjacent to the first green light emitting element ED_G1 or the second green light emitting element ED_G2 in the first direction DR1. In the first reference pixel unit row, the first light detection element OPD1 and the first green light emitting element ED_G1 are adjacent to each other in the first direction DR1, and the second light detection element OPD2 and the second green light emitting element ED_G2 are adjacent to each other in the first direction DR1. In the second reference pixel unit row, the first light detection element OPD1 and the second green light emitting element ED_G2 are adjacent to each other in the first direction DR1, and the second light detection element OPD2 and the first green light emitting element ED_G1 are adjacent to each other in the first direction DR1. As an example of the inventive concept, each of the first and second light detection elements OPD1 and OPD2 is disposed between the first and second green light emitting elements ED_G1 and ED_G2 adjacent to each other in the first direction DR1.

Each of the first and second light detection elements OPD1 and OPD2 may have the same size and the same shape. Each of the first and second light detection elements OPD1 and OPD2 may have a smaller size than the red and blue light emitting elements ED_R and ED_B. As an example of the inventive concept, each of the first and second light detection elements OPD1 and OPD2 may have a size smaller than or equal to that of the first and second green light emitting elements ED_G1 and ED_G2. However, the size of each of the first and second light detection elements OPD1 and OPD2 is not particularly limited thereto and may be applied with various modifications. Each of the first and second light detection elements OPD1 and OPD2 may have a shape different from that of the red and blue light emitting elements ED_R and ED_B. As an example of the inventive concept, each of the first and second light detection elements OPD1 and OPD2 may have a square shape. The shape of each of the first and second light detection elements OPD1 and OPD2 is not necessarily limited thereto. Alternatively, each of the first and second light detection elements OPD1 and OPD2 may have a rectangular shape longer in the first direction DR1 than in the second direction DR2.

The sensor driving circuit O_SD is electrically connected to one (e.g., the first light detection element OPD1) of the first and second light detection elements OPD1 and OPD2. The sensor driving circuit O_SD may have the same length as the red and blue pixel driving circuits R_PD and B_PD in the first direction DR1. The sensor driving circuit O_SD may at least partially overlap one (e.g., the first light detection element OPD1) of the first and second light detection elements OPD1 and OPD2 in a plan view. The sensor driving circuit O_SD may at least partially overlap one (e.g., the first green light emitting element ED_G1) of the first and second green light emitting elements ED_G1 and ED_G2 in a plan view.

The first light detection element OPD1 includes a first sensing anode electrode O_E1 and a first photoelectric conversion layer A_RL1, and the second light detection element OPD2 includes a second sensing anode electrode O_AE2 and a second photoelectric conversion layer A_RL2. The first sensing anode electrode O_E1 is directly connected to the sensor driving circuit O_SD through a contact hole.

Each of the sensors FX may further include a routing wire RW for electrically connecting the first and second light detection elements OPD1 and OPD2. The routing wire RW is electrically connected to the first sensing anode electrode O_E1 and the second sensing anode electrode O_AE2. As an example of the inventive concept, the routing wire RW may be integrally formed with the first sensing anode electrode O_E1 and the second sensing anode electrode O_E1.

The routing wire RW, the first sensing anode electrode O_E1 and the second sensing anode electrode O_AE2 may be disposed on the same layer as the anode electrodes R_AE, G1_AE, G2_AE, and B_AE. In this case, the routing wire RW, the first sensing anode electrode O_E1, and the second sensing anode electrode O_AE2 may include the same material as the anode electrodes R_AE, G1_AE, G2_AE, and B_AE, and may be provided through the same process.

The first and second light detection elements OPD1 and OPD2 may be electrically connected in parallel to the sensor driving circuit O_SD by the routing wires RW. Accordingly, the first and second light detection elements OPD1 and OPD2 may be simultaneously turned on or simultaneously turned off by the sensor driving circuit O_SD.

As shown in FIG. 4B, when k is 4, a light detection unit LSUa may include four light detection elements (hereinafter, first to fourth light detection elements OPD1, OPD2, OPD3, and OPD4). One (e.g., a third light detection element OPD3) of the first to fourth light detection elements OPD1, OPD2, OPD3, and OPD4 is electrically connected to a sensor driving circuit O_SDa.

Each of the sensors FX may further include three routing wires (hereinafter referred to as first to third routing wires RW1, RW2, and RW3) electrically connecting the first to fourth light detection elements OPD1, OPD2, OPD3, and OPD4. The first routing wire RW1 electrically connects two light detection elements (i.e., the first and third light detection elements OPD1 and OPD3) adjacent in the first direction DR1 among the four light detection elements OPD1, OPD2, OPD3, and OPD4. The second routing wire RW2 electrically connects two light detection elements (i.e., the first and second light detection elements OPD1 and OPD2) adjacent to each other in the second direction DR2 among the four light detection elements OPD1, OPD2, OPD3, and OPD4. The third routing wire RW3 electrically connects two light detection elements (i.e., the third and fourth light detection elements OPD3 and OPD4) adjacent to each other in the second direction DR2 among the four light detection elements OPD1, OPD2, OPD3, and OPD4.

The first light detection element OPD1 includes a first sensing anode electrode O_E1 and a first photoelectric conversion layer A_RL1, and the second light detection element OPD2 includes a second sensing anode electrode O_AE2 and a second photoelectric conversion layer A_RL2. The third light detection element OPD3 includes a third sensing anode electrode O_AE3 and a third photoelectric conversion layer A_RL3, and the fourth light detection element OPD4 includes a fourth sensing anode electrode O_AE4 and a fourth photoelectric conversion layer A_RL4. The third sensing anode electrode O_AE3 is directly connected to the sensor driving circuit O_SDa through a contact hole. The sensor driving circuit O_SDa may have a greater length than the red and blue pixel driving circuits R_PD and B_PD in the first direction DR1. Accordingly, the sensor driving circuit O_SDa may be disposed to at least partially overlap two (e.g., first and third light detection elements OPD1 and OPD3) of the first to fourth light detection elements OPD1 to OPD4 in a plan view. The sensor driving circuit O_SDa may at least partially overlap two green light emitting elements (e.g., first and second green light emitting elements ED_G1 and ED_G2) in a plan view.

The first routing wire RW1 is electrically connected to the first sensing anode electrode O_E1 and the third sensing anode electrode O_AE3, and the second routing wire RW2 is electrically connected to the first sensing anode electrode O_E1 and the second sensing anode electrode O_AE2. The third routing wire RW3 is electrically connected to the third sensing anode electrode O_AE3 and the fourth sensing anode electrode O_AE4. As an example of the inventive concept, the first to third routing wires RW1 to RW3 may be integrally formed with the first to fourth sensing anode electrodes O_E1 to O_AE4.

The first to third routing wires RW1, RW2, RW3 and the first to fourth sensing anode electrodes O_E1 to O_AE4 may be disposed on the same layer as the anode electrodes R_AE, G1_AE, G2_AE, and B_AE. In this case, the first to third routing wires RW1, RW2, RW3 and the first to fourth sensing anode electrodes O_E1 to O_AE4 include the same material as the anode electrodes R_AE, G1_AE, G2_AE, and B_AE, and may be provided through the same process.

The first to fourth light detection elements OPD1, OPD2, OPD3, and OPD4 may be electrically connected in parallel to the sensor driving circuit O_SDa by the first to third routing wires RW1, RW2, and RW3. Accordingly, the first to fourth light detection elements OPD1, OPD2, OPD3, and OPD4 may be simultaneously turned on or simultaneously turned off by the sensor driving circuit O_SDa.

The sensor driving circuit O_SD or O_SDa may include a plurality of transistors. As an example of the inventive concept, the sensor driving circuit O_SD or O_SDa and the pixel driving circuits R_PD, G1_PD, G2_PD, and B_PD may be simultaneously formed through the same process. Also, the scan driver 300 (refer to FIG. 3) may include transistors formed through the same process as the sensor driving circuit O_SD or O_SDa and the pixel driving circuits R_PD, G1_PD, G2_PD, and B_PD.

Figure 5A:
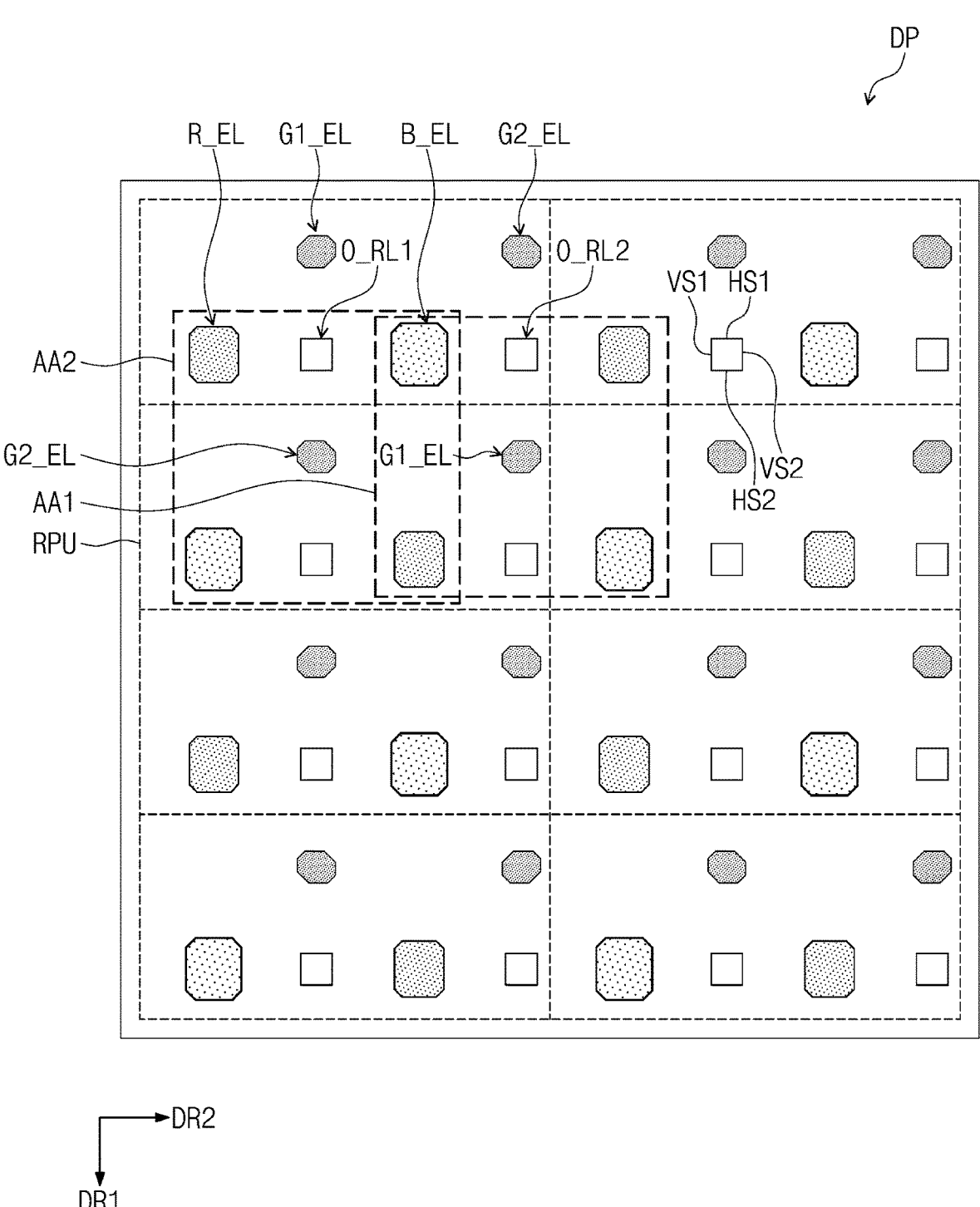
FIG. 5A is a plan view illustrating the light emitting layers shown in FIG. 4A.
Figure 5B:
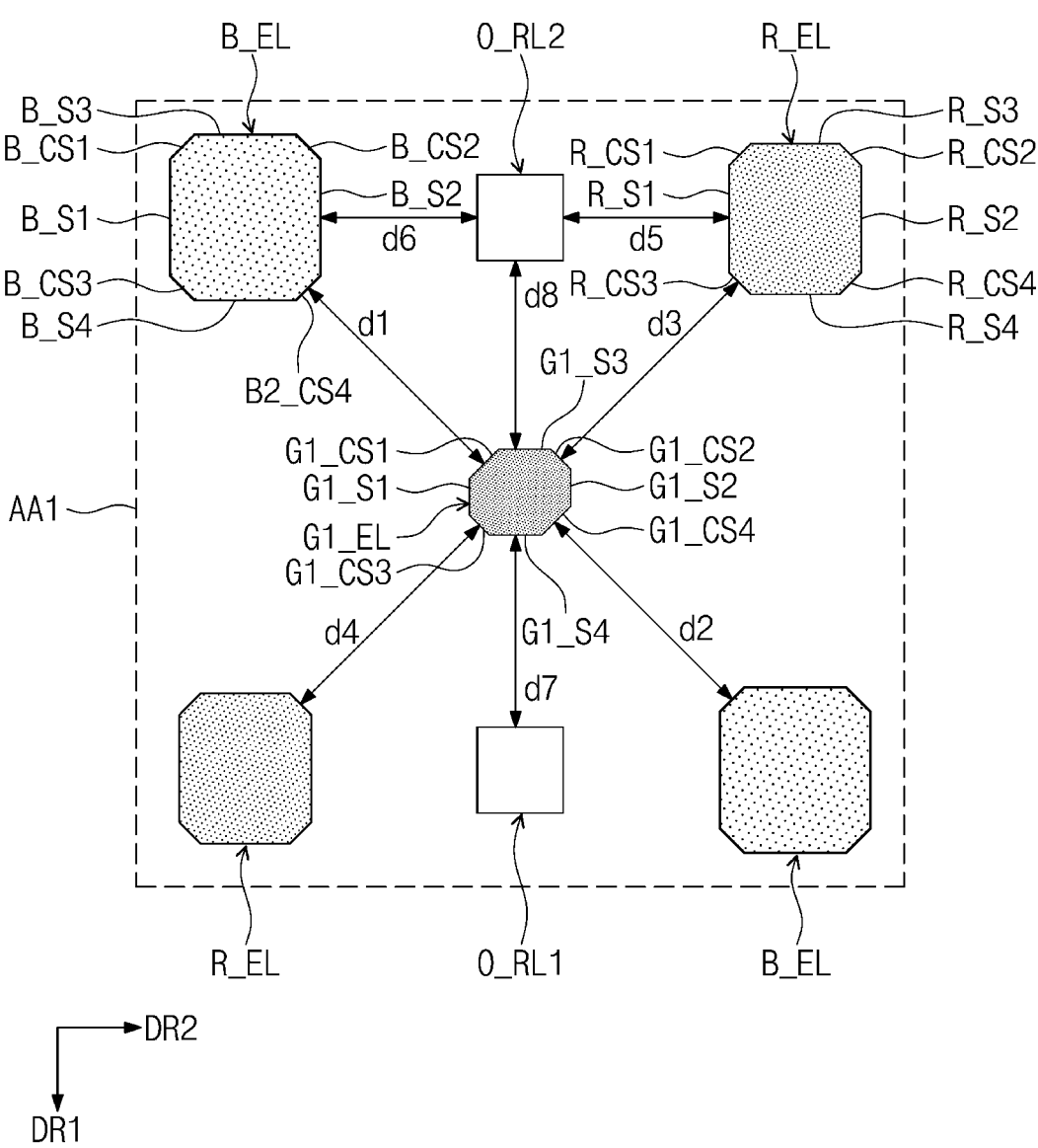
FIG. 5B is an enlarged view of the partial area AA1 illustrated in FIG. 5A.
Figure 5C:
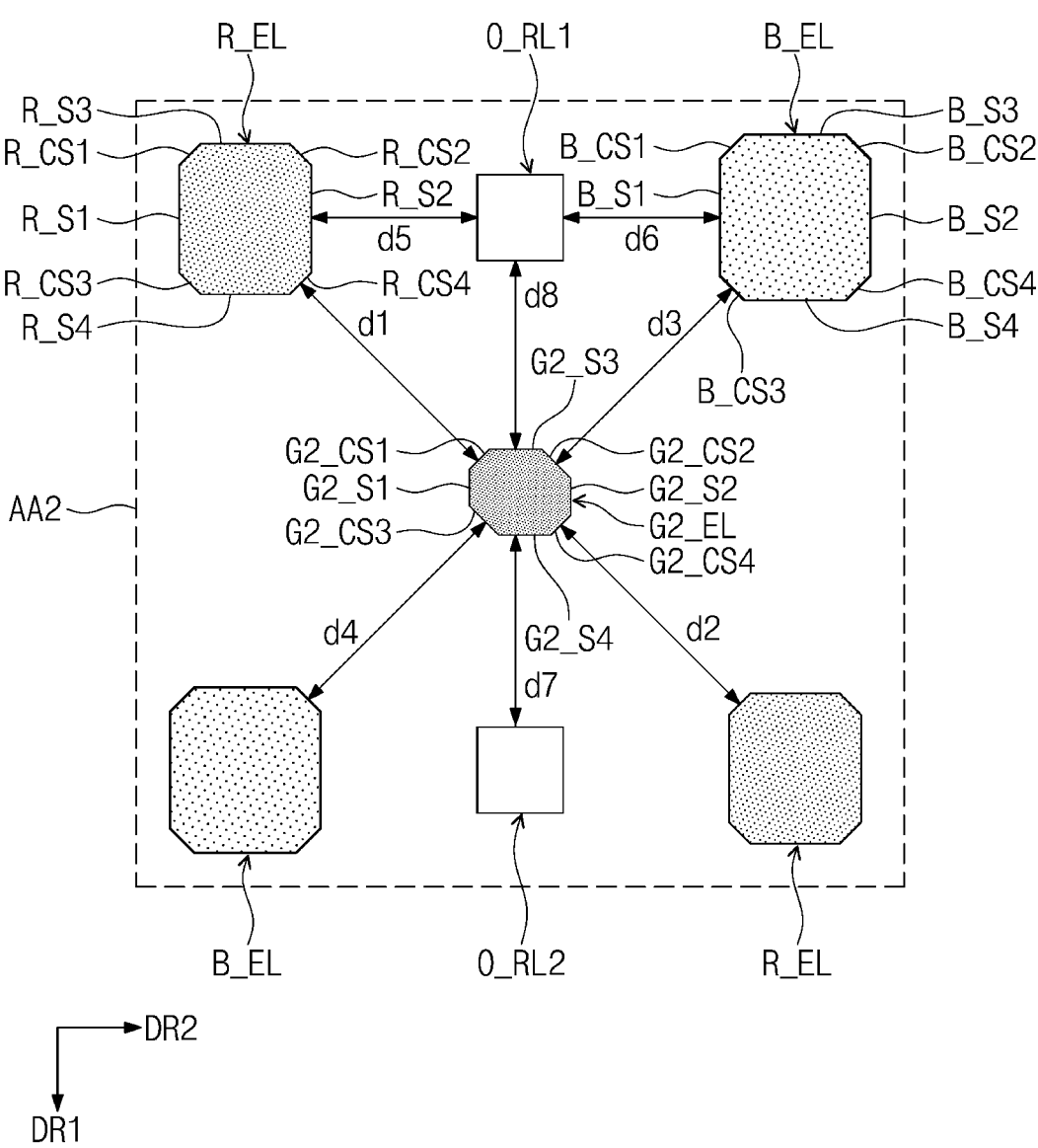
FIG. 5C is an enlarged view of the partial area AA2 illustrated in FIG. 5A.

FIG. 5A is a plan view showing the light emitting layers shown in FIG. 4A, FIG. 5B is an enlarged view of a partial area AA1 illustrated in FIG. 5A, and FIG. 5C is an enlarged view of a partial area AA2 illustrated in FIG. 5A.

Referring to FIGS. 5A to 5C, the red light emitting layer R_EL includes first and second sides R_S1 and R_S2 extending in the first direction DR1, third and fourth sides R_S3 and R_S4 extending in the second direction DR2, and first to fourth inclined sides R_CS1, R_CS2, R_CS3, and R_CS4 inclined with respect to the first and second directions DR1 and DR2. The lengths of the first and second sides R_S1 and R_S2 may be greater than the lengths of the third and fourth sides R_S3 and R_S4. However, the inventive concept is not necessarily limited thereto. Alternatively, when the red light emitting layer R_EL has an octagonal shape longer in the second direction DR2 than in the first direction DR1, lengths of the third and fourth sides R_S3 and R_S4 may be greater than lengths of the first and second sides R_S1 and R_S2.

In the red light emitting layer R_EL, the first to fourth inclined sides R_CS1, R_CS2, R_CS3, and R_CS4 may have the same length. Each of the first to fourth inclined sides R_CS1, R_CS2, R_CS3, and R_CS4 in FIGS. 5A to 5C may have a linear shape. However, the inventive concept is not necessarily limited thereto. Alternatively, each of the first to fourth inclined sides R_CS1, R_CS2, R_CS3, and R_CS4 may have a curved shape.

The shape of the emission area of the red light emitting element ED_R may be defined by the shape of the red light emitting layer R_EL. Accordingly, the shape of the red light emitting layer R_EL may be referred to as the shape of the emission area of the red light emitting element ED_R or the shape of the red light emitting element ED_R.

The blue light emitting layer B_EL includes first and second sides B_S1 and B_S2 extending in the first direction DR1, third and fourth sides B_S3 and B_S4 extending in the second direction DR2, and first to fourth inclined sides B_CS1, B_CS2, B_CS3, and B_CS4 inclined with respect to the first and second directions DR1 and DR2. The lengths of the first and second sides B_S1 and B_S2 may be greater than the lengths of the third and fourth sides B_S3 and B_S4. However, the inventive concept is not necessarily limited thereto. Alternatively, when the blue light emitting layer B_EL has an octagonal shape longer in the second direction DR2 than the first direction DR1, lengths of the third and fourth sides B_S3 and B_S4 may be greater than lengths of the first and second sides B_S1 and B_S2.

In the blue light emitting layer B_EL, the lengths of the first to fourth inclined sides B_CS1, B_CS2, B_CS3, and B_CS4 may be the same. Each of the first to fourth inclined sides B_CS1, B_CS2, B_CS3, and B_CS4 in FIGS. 5A to 5C may have a linear shape. However, the inventive concept is not necessarily limited thereto. Alternatively, each of the first to fourth inclined sides B_CS1, B_CS2, B_CS3, and B_CS4 may have a curved shape.

The shape of the emission area of the blue light emitting element ED_B may be defined by the shape of the blue light emitting layer B_EL. Accordingly, the shape of the blue light emitting layer B_EL may be referred to as the shape of the emission area of the blue light emitting element ED_B or the shape of the blue light emitting element ED_B.

FIGS. 5A to 5C show that each of the red light emitting layer R_EL and the blue light emitting layer B_EL has an elongated shape in any one of the first and second directions DR1 and DR2, but the inventive concept is not necessarily limited thereto. For example, each of the red light emitting layer R_EL and the blue light emitting layer B_EL may have an octagonal shape having the same length in the first and second directions DR1 and DR2.

The first green light emitting layer G1_EL includes first and second sides G1_S1 and G1_S2 extending in the first direction DR1, third and fourth sides G1_S3 and G1_S4 extending in the second direction DR2, and first to fourth inclined sides G1_CS1, G1_CS2, G1_CS3, and G1_CS4 inclined with respect to the first and second directions DR1 and DR2. In the first green light emitting layer G1_EL, lengths of the first and second sides G1_S1 and G1_S2 may be different from lengths of the third and fourth sides G1_S3 and G1_S4. An interval between the first side G1_S1 and the second side G1_S2 of the first green light emitting layer G1_EL may be greater than an interval between the third side G1_S3 and the fourth side G1_S4 of the first green light emitting layer G1_EL. For example, an interval between the first side G1_S1 and the second side G1_S2 of the first green light emitting layer G1_EL is about 18.96 and an interval between the third side G1_S3 and the fourth side G1_S4 of the first green light emitting layer G1_EL may be about 13.92 µm.

In the first green light emitting layer G1_EL, lengths of the first and fourth inclined sides G1_CS1, and G1_CS4 facing each other may be the same, and lengths of the second and third inclined sides G1_CS2 and G1_CS3 facing each other may be the same. The lengths of the first and second inclined sides G1_CS1 and G1_CS2 may be different from each other, and the lengths of the third and fourth inclined sides G1_CS3 and G1_CS4 may be different from each other. As an example of the inventive concept, when the blue light emitting layer B_EL has a larger size than the red light emitting layer R_EL, the lengths of the first and fourth inclined sides G1_CS1 and G1_CS4 of the first green light emitting layer G1_EL may be greater than the lengths of the second and third inclined sides G1_CS2 and G1_CS3 of the first green light emitting layer G1_EL. In addition, the interval between the second and third inclined sides G1_CS2 and G1_CS3 of the first green light emitting layer G1_EL may be greater than the interval between the first and fourth inclined sides G1_CS1 and G1_CS4 of the first green light emitting layer G1_EL. For example, the interval between the second and third inclined sides G1_CS2, and G1_CS3 of the first green light emitting layer G1_EL may be about 17.72 µm, and the interval between the first and fourth inclined sides G1_CS1 and G1_CS4 of the first green light emitting layer G1_EL may be about 15.98 µm.

The first and fourth inclined sides G1_CS1 and G1_CS4 of the first green light emitting layer G1_EL may be parallel to the first or fourth inclined sides B_CS1 or B_CS4 of the adjacent blue light emitting layer B_EL. The second and third inclined sides G1_CS2 and G1_CS3 of the first green light emitting layer G1_EL may be parallel to the second or third inclined side R_CS2 or R_CS3 of the adjacent red light emitting layer R_EL. Alternatively, each of the first to fourth inclined sides G1_CS1, G1_CS2, G1_CS3, and G1_CS4 may have a curved shape.

The first inclined side G1_CS1 of the first green light emitting layer G1_EL is spaced apart from the fourth inclined side B_CS4 of the adjacent blue light emitting layer B_EL by a first interval d1, and the fourth inclined side G1_CS4 of the first green light emitting layer G1_EL is spaced apart from the first inclined side B_CS1 of the adjacent blue light emitting layer B_EL by a second interval d2. The second inclined side G1_CS2 of the first green light emitting layer G1_EL is spaced apart from the third inclined side R_CS3 of the adjacent red light emitting layer R_EL by a third interval d3, and the third inclined side G1_CS3 of the first green light emitting layer G1_EL is spaced apart from the second inclined side R_CS2 of the adjacent red light emitting layer R_EL by a fourth interval d4. As an example of the inventive concept, the first to fourth intervals d1 to d4 may be equal to each other. For example, each of the first to fourth intervals d1 to d4 may be about 22.11 μm.

The second green light emitting layer G2_EL includes first and second sides G2_S1 and G2_S2 extending in the first direction DR1, third and fourth sides G2_S3 and G2_S4 extending in the second direction DR2, and first to fourth inclined sides G2_CS1, G2_CS2, G2_CS3, and G2_CS4 inclined with respect to the first and second directions DR1 and DR2. In the second green light emitting layer G2_EL, lengths of the first and second sides G2_S1 and G2_S2 may be different from lengths of the third and fourth sides G2_S3 and G2_S4. The interval between the first side G2_S1 and the second side G2_S2 of the second green light emitting layer G2_EL may be greater than the interval between the third side G2_S3 and the fourth side G2_S4 of the second green light emitting layer G2_EL. For example, an interval between the first side G2_S1 and the second side G2_S2 of the second green light emitting layer G2_EL is about 18.96 μm, and an interval between the third side G2_S3 and the fourth side G2_S4 of the second green light emitting layer G2_EL may be about 13.92 μm.

In the second green light emitting layer G2_EL, lengths of the first and fourth inclined sides G2_CS1, and G2_CS4 facing each other may be the same, and lengths of the second and third inclined sides G2_CS2 and G2_CS3 facing each other may be the same. The lengths of the first and second inclined sides G2_CS1 and G2_CS2 may be different from each other, and the lengths of the third and fourth inclined sides G2_CS3 and G2_CS4 may be different from each other. As an example of the inventive concept, when the blue light emitting layer B_EL has a larger size than the red light emitting layer R_EL, the lengths of the first and fourth inclined sides G2_CS1 and G2_CS4 of the second green light emitting layer G2_EL may be greater than the lengths of the second and third inclined sides G2_CS2 and G2_CS3 of the second green light emitting layer G3_EL. In addition, the interval between the first and fourth inclined sides G2_CS1 and G2_CS4 of the second green light emitting layer G2_EL may be greater than the interval between the second and third inclined sides G2_CS2 and G3_CS3 of the second green light emitting layer G2_EL. For example, the interval between the first and fourth inclined sides G2_CS1 and G2_CS4 of the second green light emitting layer G2_EL may be about 17.72 and the interval between the second and third inclined sides G2_CS2 and G3_CS3 of the second green light emitting layer G2_EL may be about 15.98 μm.

The first and fourth inclined sides G2_CS1 and G2_CS4 of the second green light emitting layer G2_EL may be parallel to the first or fourth inclined sides R_CS1 or R_CS4 of the adjacent red light emitting layer R_EL. The second and third inclined sides G2_CS2 and G2_CS3 of the second green light emitting layer G2_EL may be parallel to the second or third inclined side B_CS2 or B_CS3 of the adjacent blue light emitting layer B_EL. Alternatively, each of the first to fourth inclined sides G2_CS1, G2_CS2, G2_CS3, and G2_CS4 may have a curved shape.

The first inclined side G2_CS1 of the second green light emitting layer G2_EL is spaced apart from the fourth inclined side R_CS4 of the adjacent red light emitting layer R_EL by a first interval d1, and the fourth inclined side G2_CS4 of the second green light emitting layer G2_EL is spaced apart from the first inclined side R_CS1 of the adjacent red light emitting layer R_EL by a second interval d2. The second inclined side G2_CS2 of the second green light emitting layer G2_EL is spaced apart from the third inclined side B_CS3 of the adjacent blue light emitting layer B_EL by a third interval d3, and the third inclined side G2_CS3 of the second green light emitting layer G2_EL is spaced apart from the second inclined side B_CS2 of the adjacent blue light emitting layer B_EL by a fourth interval d4. As an example of the inventive concept, the first to fourth intervals d1 to d4 may be equal to each other. For example, each of the first to fourth intervals d1 to d4 may be about 22.11 μm.

The first green light emitting layer G1_EL and the second green light emitting layer G2_EL may have the same size and different shapes. As an example of the inventive concept, the first green light emitting layer G1_EL and the second green light emitting layer G2_EL have different shapes on the same plane. For example, the first green light emitting layer G1_EL and the second green light emitting layer G2_EL may have different shapes, but may have shapes symmetrical with respect to each other in the first and second directions DR1 and DR2. The shape of the emission area of the first and second green light emitting elements ED_G1 and ED_G2 may be defined by the shape of each of the first and second green light emitting layers G1_EL and G2_EL. Accordingly, the shape of the first green light emitting layer G1_EL may be referred to as the shape of the emission area of the first green light emitting element ED_G1 or the shape of the first green light emitting element ED_G1, and the shape of each of the second green light emitting layers G2_EL may be referred to as the shape of the emission area of the second green light emitting element ED_G2 or the shape of the second green light emitting element ED_G2.

The first and second photoelectric conversion layers O_RL1 and O_RL2 have the same shape. The first and second photoelectric conversion layers O_RL1 and O_RL2 may have different shapes from the red and blue light emitting layers R_EL and B_EL. As an example of the inventive concept, each of the first and second photoelectric conversion layers O_RL1 and O_RL2 may have a square shape. The shapes of the light receiving areas of the first and second light detection elements OPD1 and OPD2 may be defined by the shapes of the first and second photoelectric conversion layers O_RL1 and O_RL2, respectively. Accordingly, the shape of the first photoelectric conversion layer O_RL1 may be referred to as the shape of the light receiving area of the first light detection element OPD1 or the shape of the first light detection element OPD1, and the shape of the second photoelectric conversion layer O_RL2 may be referred to as the shape of the light receiving area of the second light detection element OPD2 or the shape of the second light detection element OPD2.

Each of the first and second photoelectric conversion layers O_RL1 and O_RL2 includes first and second vertical sides VS1 and VS2 extending in the first direction DR1 and first and second horizontal sides HS1 and HS2 extending in the second direction DR2. As an example, the lengths of the first and second vertical sides VS1 and VS2 may be the same as the lengths of the first and second horizontal sides HS1 and HS2. The first and second vertical sides VS1 and VS2 and the first and second horizontal sides HS1 and HS2 may have a length less than or equal to at least one of the first to fourth sides R_S1 to R_S4 of the red light emitting layer R_EL or the first to fourth sides B_S1 to B_S4 of the blue light emitting layer B_EL Alternatively, each of the first and second photoelectric conversion layers O_RL1 and O_RL2 may have a rectangular shape elongated in the first direction DR1 or the second direction DR2.

The first and second vertical sides VS1 and VS2 of each of the first and second photoelectric conversion layers O_RL1 and O_RL2 may be spaced apart from adjacent red and blue light emitting layers R_EL and B_EL, respectively, by fifth and sixth intervals d5 and d6. As an example of the inventive concept, the fifth and sixth intervals d5 and d6 may be identical to each other. For example, the fifth and sixth intervals d5 and d6 may be about 16.5 The first horizontal side HS1 of the first photoelectric conversion layer O_RL1 is spaced apart from the adjacent first green light emitting layer G1_EL by a seventh interval d7, and the second horizontal side HS2 of the first photoelectric conversion layer O_RL1 is spaced apart from the adjacent second green light emitting layer G2_EL by an eighth interval d8. The first horizontal side HS1 of the second photoelectric conversion layer O_RL2 is spaced apart from the adjacent second green light emitting layer G2_EL by a seventh interval d7, and the second horizontal side HS2 of the second photoelectric conversion layer O_RL2 is spaced apart from the adjacent first green light emitting layer G1_EL by an eighth interval d8. As an example of the inventive concept, the seventh and eighth intervals d7 and d8 may be different from each other. For example, the seventh interval d7 may be about 16.5 and the eighth interval d8 may be about 17.8 Alternatively, the seventh and eighth intervals d7 and d8 may be equal to each other.

Figure 6A:
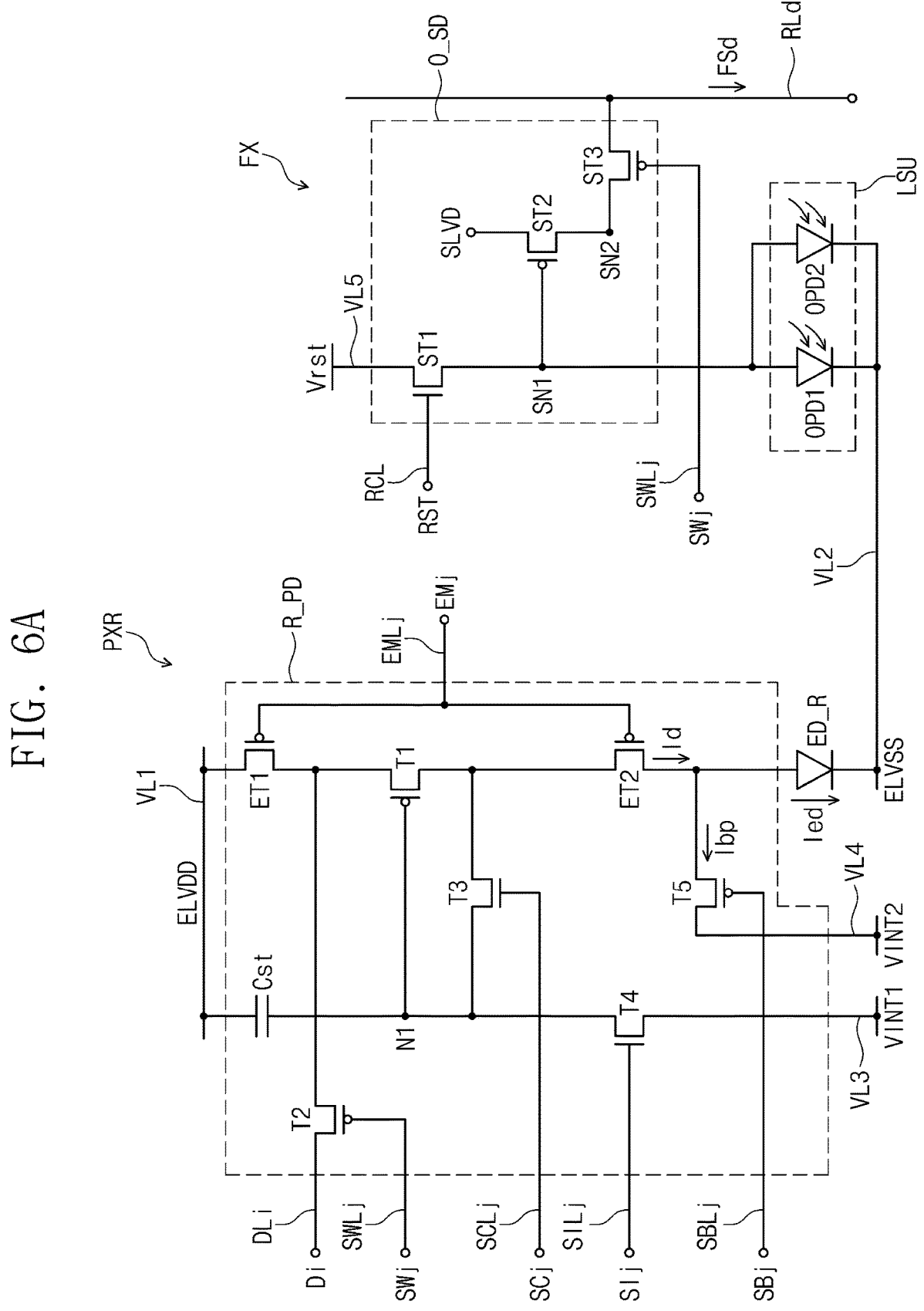
FIG. 6A is a circuit diagram illustrating a pixel and a sensor according to an embodiment of the inventive concept.
Figure 6B:
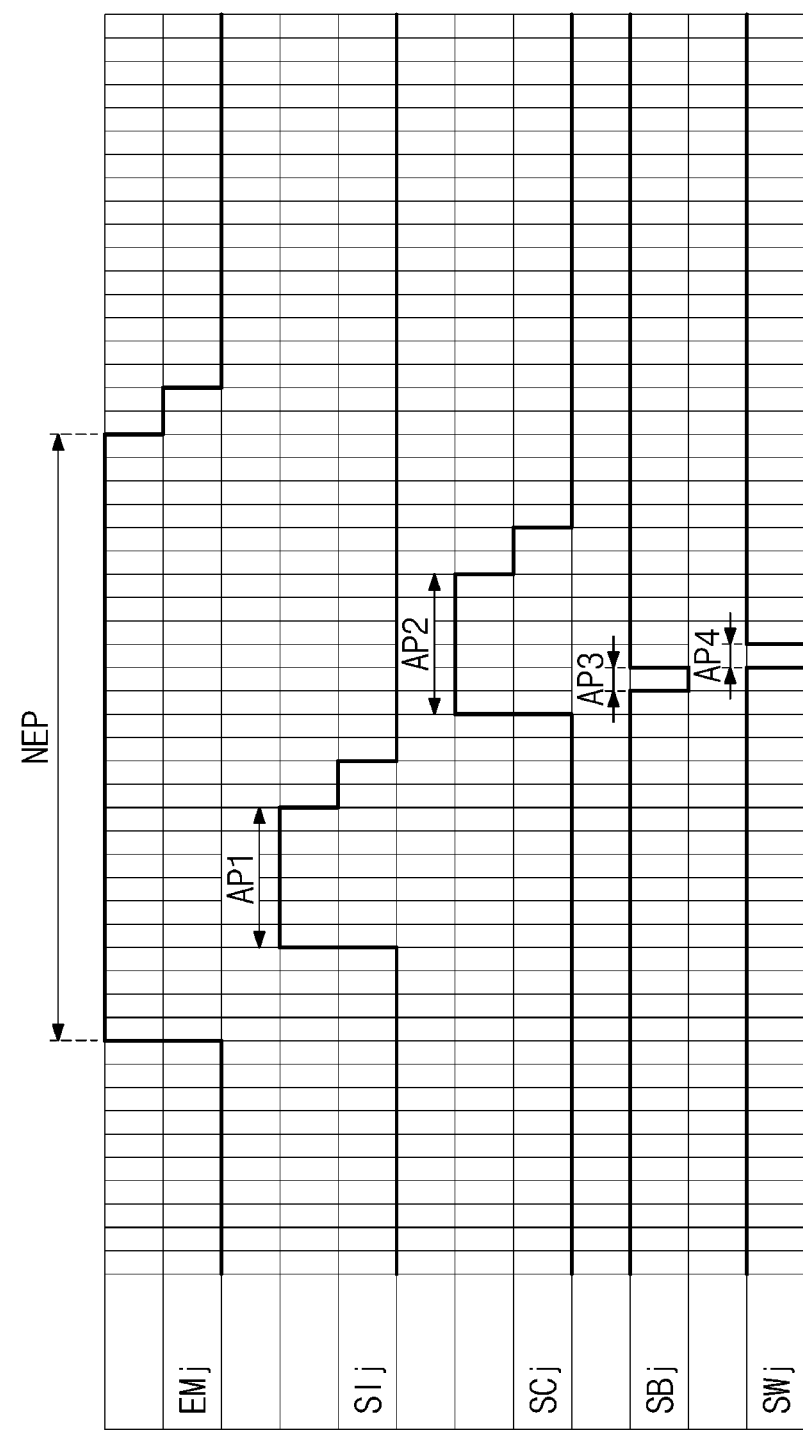
FIG. 6B is a waveform diagram for explaining the operation of the pixel and the sensor illustrated in FIG. 6A.

FIG. 6A is a circuit diagram illustrating a pixel and a sensor according to an embodiment of the inventive concept, and FIG. 6B is a waveform diagram for explaining the operation of the pixel and the sensor illustrated in FIG. 6A.

FIG. 6A exemplarily illustrates an equivalent circuit diagram of one pixel (e.g., the red pixel PXR) among the plurality of pixels PX illustrated in FIG. 3. It may be assumed that to the extent that description of various elements has been omitted, those elements may be at least similar to corresponding elements that have been described elsewhere within the specification. For example, each of the plurality of pixels PX has the same circuit structure, with a description of the circuit structure of the red pixel PXR. Also, FIG. 6A exemplarily shows an equivalent circuit diagram of one sensor FX among the plurality of sensors FX illustrated in FIG. 3. It may be assumed that each of the plurality of sensors FX has the same circuit structure.

Referring to FIG. 6A, the red pixel PXR is electrically connected to an i-th data line DLi among the data lines DL1 to DLm, a j-th initialization scan line SILj among the initialization scan lines SIL1 to SILn, a j-th compensation scan SCLj among the compensation scan lines SCL1 to SCLn, a j-th write scan line SWLj among the write scan lines SWL1 to SWLn, a j-th black scan line SBLj among the black scan lines SBL1 to SBLn, and a j-th emission control line EMLj among the emission control lines EML1 to EMLn.

The red pixel PXR includes a red light emitting element ED_R and a red pixel driving circuit R_PD. The red light emitting element ED_R may be a light emitting diode. As an example of the inventive concept, the red light emitting element ED_R may be an organic light emitting diode including an organic light emitting layer.

The red pixel driving circuit R_PD includes first to fifth transistors T1, T2, T3, T4, and T5, first and second emission control transistors ET1 and ET2, and one capacitor Cst. At least one of the first to fifth transistors T1, T2, T3, T4, and T5, the first and second emission control transistors ET1 and ET2 may be a transistor having a low-temperature polycrystalline silicon (LTPS) semiconductor layer. Some of the first to fifth transistors T1, T2, T3, T4, and T5, the first and second emission control transistors ET1 and ET2 may be P-type transistors, and the remaining may be N-type transistors. For example, the first, second, and fifth transistors T1, T2, and T5, and the first and second emission control transistors ET1 and ET2 may be PMOS transistors, and the third and fourth transistors T3 and T4 may be NMOS transistors. At least one of the first to fifth transistors T1, T2, T3, T4, and T5, the first and second emission control transistors ET1 and ET2 may be a transistor having a low-temperature polycrystalline silicon (LTPS) semiconductor layer. For example, the third and fourth transistors T3 and T4 are oxide semiconductor transistors, and the first, second, and fifth transistors T1, T2, and T5, the first and second emission control transistors ET1 and ET2 may be LTPS transistors.

The configuration of the red pixel driving circuit R_PD, according to the inventive concept, is not necessarily limited to the embodiment illustrated in FIG. 6A. The red pixel driving circuit R_PD illustrated in FIG. 6A is only an example, and the configuration of the red pixel driving circuit R_PD may be modified. For example, all of the first to fifth transistors T1, T2, T3, T4, and T5, the first and second emission control transistors ET1 and ET2 may be P-type transistors or N-type transistors.

The j-th initialization scan line SILj, the j-th compensation scan line SCLj, the j-th write scan line SWLj, the j-th black scan line SBLj, and the j-th emission control line EMLj may transmit the j-th initialization scan signal SIj, the j-th compensation scan signal SCj, the j-th write scan signal SWj, the j-th black scan signal SBj, and the j-th emission control signal EMj to the red pixel PXR, respectively. The i-th data line DLi transmits the i-th data signal Di to the red pixel PXR. The i-th data signal Di may have a voltage level corresponding to the image signal RGB (refer to FIG. 3) input to the display device DD (refer to FIG. 3).

Each of first and second driving voltage lines VL1 and VL2 may respectively transmit the first driving voltage ELVDD and the second driving voltage ELVSS to the red pixel PXR. Also, first and second initialization voltage lines VL3 and VL4 may respectively transmit the first initialization voltage VINT1 and the second initialization voltage VINT2 to the red pixel PXR.

The first transistor T1 is electrically connected between the first driving voltage line VL1 receiving the first driving voltage ELVDD and the red light emitting element ED_R. The first transistor T1 includes a first electrode electrically connected to the first driving voltage line VL1 via the first emission control transistor ET1, a second electrode electrically connected to the red anode electrode R_AE (see FIG. 5A) of the red light emitting element ED_R via the second emission control transistor ET2, and a third electrode (e.g., a gate electrode) electrically connected to one end (e.g., a first node N1) of the capacitor Cst. The first transistor T1 may receive the i-th data signal Di transmitted from the i-th data line DLi according to the switching operation of the second transistor T2, and supply a driving current Id to the red light emitting element ED_R.

The second transistor T2 is electrically connected between the i-th data line DLi and the first electrode of the first transistor T1. The second transistor T2 includes a first electrode electrically connected to the i-th data line DLi, a second electrode electrically connected to the first electrode of the first transistor T1, and a third electrode (e.g., a gate electrode) electrically connected to the j-th write scan line SWLj. The second transistor T2 is turned on according to the write scan signal SWj received through the j-th write scan line SWLj to transmit the i-th data signal Di transmitted from the i-th data line DLi to the first electrode of the first transistor T1.

The third transistor T3 is electrically connected between the second electrode of the first transistor T1 and the first node N1. The third transistor T3 includes a first electrode electrically connected to the third electrode of the first transistor T1, a second electrode electrically connected to the second electrode of the first transistor T1, and a third electrode (e.g., a gate electrode) electrically connected to the j-th compensation scan line SCLj. The third transistor T3 is turned on according to the j-th compensation scan signal SCj received through the j-th compensation scan line SCLj to diode-connect the first transistor T1 by connecting the third electrode and the second electrode of the first transistor T1 to each other.

The fourth transistor T4 is electrically connected between the first initialization voltage line VL3 to which the first initialization voltage VINT1 is applied and the first node N1. The fourth transistor T4 includes a first electrode electrically connected to the first initialization voltage line VL3 to which the first initialization voltage VINT1 is transmitted, a second electrode electrically connected to the first node N1, and a third electrode (e.g., a gate electrode) electrically connected to the j-th initialization scan line SILj. The fourth transistor T4 is turned on according to the j-th initialization scan signal SIj received through the j-th initialization scan line SILj. The turned-on fourth transistor T4 transmits the first initialization voltage VINT1 to the first node N1 to initialize the potential (i.e., the potential of the first node N1) of the third electrode of the first transistor T1.

The first emission control transistor ET1 includes a first electrode electrically connected to the first driving voltage line VL1, a second electrode electrically connected to the first electrode of the first transistor T1, and a third electrode (e.g., a gate electrode) electrically connected to the j-th emission control line EMLj.

The second emission control transistor ET2 includes a first electrode electrically connected to the second electrode of the first transistor T1, a second electrode electrically connected to the red anode R_AE (refer to FIGS. 4A and 4B) of the red light emitting element ED_R, and a third electrode (e.g., a gate electrode) electrically connected to the j-th emission control line EMLj.

The first and second emission control transistors ET1 and ET2 are simultaneously turned on according to the j-th emission control signal EMj transmitted through the j-th emission control line EMLj. The first driving voltage ELVDD applied through the turned-on first emission control transistor ET1 may be compensated through the diode-connected first transistor T1 and then transmitted to the red light emitting element ED_R.

The fifth transistor T5 includes a first electrode electrically connected to the second initialization voltage line VL4 to which the second initialization voltage VINT2 is transmitted, a second electrode electrically connected to the second electrode of the second emission control transistor ET2, and a third electrode (e.g., a gate electrode) electrically connected to the black scan line SBLj. The second initialization voltage VINT2 may have a voltage level equal to or lower than the first initialization voltage VINT1.

As described above, one end of the capacitor Cst is electrically connected to the third electrode of the first transistor T1, and the other end is electrically connected to the first driving voltage line VL1. The cathode electrode of the red light emitting element ED_R may be electrically connected to the second driving voltage line VL2 that transmits the second driving voltage ELVSS. The second driving voltage ELVSS may have a lower voltage level than the first driving voltage ELVDD. As an example of the inventive concept, the second driving voltage ELVSS may have a lower voltage level than the first and second initialization voltages VINT1 and VINT2.

Referring to FIGS. 6A and 6B, the j-th emission control signal EMj has a high level during a non-emission section NEP. In the non-emission section NEP, the j-th initialization scan signal SIj is activated. During an activation section AP1 (hereinafter, referred to as a first activation section) of the j-th initialization scan signal SIj, when the j-th initialization scan signal SIj of a high level is provided through the j-th initialization scan line SILj, the fourth transistor T4 is turned on in response to the j-th initialization scan signal SIj having a high level. The first initialization voltage VINT1 is transferred to the third electrode of the first transistor T1 through the turned-on fourth transistor T4, and the first node N1 is initialized with the first initialization voltage VINT1. Accordingly, the first activation section AP1 may be defined as an initialization section of the red pixel PXR.

Next, the j-th compensation scan signal SCj is activated, and during an activation section AP2 (hereinafter, referred to as a second activation section) of the j-th compensation scan signal SCj, when the j-th compensation scan signal SCj of a high level is supplied through the j-th compensation scan line SCLj, the third transistor T3 is turned on. The first transistor T1 is diode-connected by the turned-on third transistor T3 and is biased in a forward direction. The first activation section AP1 might not overlap the second activation section AP2.

The j-th write scan signal SWj is activated in the second activation section AP2. The j-th write scan signal SWj has a low level during an activation section AP4 (hereinafter, referred to as a fourth activation section). During the fourth activation section AP4, the second transistor T2 is turned on by the j-th write scan signal SWj having a low level. Then, a compensation voltage "Di-Vth" reduced by the threshold voltage Vth of the first transistor T1 in the i-th data signal Di supplied from the i-th data line DLi is applied to the third electrode of the first transistor T1. For example, the potential of the third electrode of the first transistor T1 may be the compensation voltage "Di-Vth". The fourth activation section AP4 may at least partially overlap the second activation section AP2. A duration of the second activation section AP2 may be greater than a duration of the fourth activation section AP4.

The first driving voltage ELVDD and the compensation voltage "Di-Vth" are applied to both ends of the capacitor Cst, and a charge corresponding to a voltage difference between both ends may be stored in the capacitor Cst. Here, the high-level section of the j-th compensation scan signal SCj may be referred to as a compensation section of the red pixel PXR.

The j-th black scan signal SBj is activated in the second activation section AP2 of the j-th compensation scan signal SCj. The j-th black scan signal SBj has a low level during an activation section AP3 (hereinafter, referred to as a third activation section). During the third activation section AP3, the fifth transistor T5 is turned on by receiving the j-th black scan signal SBj of a low level through the j-th black scan line SBLj. A portion of the driving current Id by the fifth transistor T5 may escape through the fifth transistor T5 as the bypass current Ibp. The third activation section AP3 may at least partially overlap the second activation section AP2. The duration of the second activation section AP2 may be greater than a duration of the third activation section AP3. The third activation section AP3 may precede the fourth activation section AP4 and might not overlap the fourth activation section AP4.

When the red pixel PXR displays a black image, if the red light emitting element ED_R emits light even if the minimum driving current of the first transistor T1 flows as the driving current Id, the red pixel PXR cannot normally display a black image. Accordingly, the fifth transistor T5 in the red pixel PXR, according to an embodiment of the inventive concept, may distribute a portion of the minimum driving current of the first transistor T1 as the bypass current Ibp to a current path other than the current path toward the red light emitting element ED_R. Here, the minimum driving current of the first transistor T1 means a current flowing through the first transistor T1 in the condition that the gate-source voltage Vgs of the first transistor T1 is less than the threshold voltage Vth, so that the first transistor T1 is turned off. Under the condition that the first transistor T1 is turned off in this way, a minimum driving current (e.g., a current of about 10 pA or less) flowing through the first transistor T1 is transmitted to the red light emitting element ED_R to display a black grayscale image. When the red pixel PXR displays a black image, while the effect of the bypass current Ibp on the minimum drive current is relatively large, in the case of displaying an image such as a normal image or a white image, it may be said that the bypass current Ibp has little effect on the driving current Id. Therefore, when displaying a black image, the current (i.e., the light emission current Ted) reduced by the amount of the bypass current Ibp escaping from the driving current Id through the fifth transistor T5 is provided as a red light emitting element ED_R, so black images may be clearly expressed. Accordingly, the red pixel PXR may implement an accurate black grayscale image by using the fifth transistor T5, and as a result, the contrast ratio may be increased.

Next, the j-th emission control signal EMj supplied from the j-th emission control line EMLj is changed from a high level to a low level. The first and second emission control transistors ET1 and ET2 are turned on by the low level emission control signal EMj. Then, the driving current Id is generated according to a voltage difference between the voltage of the third electrode of the first transistor T1 and the first driving voltage ELVDD, and the driving current Id is supplied to the red light emitting element ED_R through the second emission control transistor ET2 so that the current Ted flows through the red light emitting element ED_R.

Referring back to FIG. 6A, the sensor FX is electrically connected to a d-th readout line RLd among the readout lines RL1 to RLh, the j-th write scan line SWLj, and a reset control line RCL.

The sensor FX includes the light detection unit LSU and the sensor driving circuit O_SD. The light detection unit LSU may include k light detection elements electrically connected in parallel to each other. When k is 2, the first and second light detection elements OPD1 and OPD2 may be electrically connected to each other in parallel. Each of the first and second light detection elements OPD1 and OPD2 may be a photodiode. As an example of the inventive concept, each of the first and second light detection elements OPD1 and OPD2 may be an organic photodiode including an organic material as a photoelectric conversion layer. The first and second anode electrodes O_E1 and O_AE2 (see FIG. 4A) of the first and second light detection elements OPD1 and OPD2 are electrically connected to a first sensing node SN1, and first and second cathode electrodes of the first and second light detection elements OPD1 and OPD2 may be electrically connected to the second driving voltage line VL2 that transmits the second driving voltage ELVSS. When k is 4, the first to fourth light detection elements OPD1 to OPD4 (refer to FIG. 4B) may be electrically connected in parallel to each other.

The sensor driving circuit O_SD includes three transistors ST1 to ST3. The three transistors ST1 to ST3 may be a reset transistor ST1, an amplification transistor ST2, and an output transistor ST3, respectively. At least one of the reset transistor ST1, the amplification transistor ST2, and the output transistor ST3 may be an oxide semiconductor transistor. As an example of the inventive concept, the reset transistor ST1 may be an oxide semiconductor transistor, and the amplification transistor ST2 and the output transistor ST3 may be an LTPS transistor. However, the inventive concept is not necessarily limited thereto, and at least the reset transistor ST1 and the output transistor ST3 may be oxide semiconductor transistors, and the amplification transistor ST2 may be then LTPS transistor.

In addition, some of the reset transistor ST1, the amplification transistor ST2, and the output transistor ST3 may be P-type transistors, and some may be N-type transistors. As an example of the inventive concept, the amplification transistor ST2 and the output transistor ST3 may be PMOS transistors, and the reset transistor ST1 may be an NMOS transistor. However, the inventive concept is not necessarily limited thereto, all of the reset transistor ST1, the amplification transistor ST2, and the output transistor ST3 may be the N-type transistors or the P-type transistors.

Some (e.g., the reset transistor ST1) of the reset transistor ST1, the amplification transistor ST2, and the output transistor ST3 may be the same type of transistor as the third and fourth transistors T3 and T4 of the red pixel PXR. The amplification transistor ST2 and the output transistor ST3 may be the same type of transistors as the first, second, and fifth transistors T1, T2 and T5, the first and second emission control transistors ET1 and ET2 of the red pixel PXR.

The circuit configuration of the sensor driving circuit O_SD, according to the inventive concept, is not necessarily limited to the arrangement shown in FIG. 6A. The sensor driving circuit O_SD illustrated in FIG. 6A is only an example, and the configuration of the sensor driving circuit O_SD may be modified.

The reset transistor ST1 includes a first electrode receiving a reset voltage Vrst, a second electrode electrically connected to the first sensing node SN1, and a third electrode receiving a reset control signal RST. The reset transistor ST1 may reset the potential of the first sensing node SN1 to the reset signal RST in response to the reset control signal RST. The reset control signal RST may be a signal provided through the reset control line RCL. However, the inventive concept is not necessarily limited thereto. Alternatively, the reset control signal RST may be the j-th compensation scan signal SCj supplied through the j-th compensation scan line SCLj. For example, the reset transistor ST1 may receive the j-th compensation scan signal SCj supplied from the j-th compensation scan line SCLj as the reset control signal RST. As an example of the inventive concept, the reset voltage Vrst may have a lower voltage level than the second driving voltage ELVSS at least during the activation section of the reset control signal RST. The reset voltage Vrst may be a DC voltage maintained at a voltage level lower than the second driving voltage ELVSS.

The reset transistor ST1 may include a plurality of sub-reset transistors electrically connected in series. For example, the reset transistor ST1 may include two sub-reset transistors (hereinafter, referred to as first and second sub-reset transistors). In this case, a third electrode of the first sub-reset transistor and a third electrode of the second sub-reset transistor are electrically connected to the reset control line RCL. Also, a second electrode of the first sub-reset transistor and a first electrode of the second sub-reset transistor may be electrically connected to each other. In addition, the reset voltage Vrst may be applied to a first electrode of the first sub-reset transistor, and a second electrode of the second sub-reset transistor may be electrically connected to the first sensing node SN1. However, the number of sub-reset transistors is not necessarily limited thereto, and may be variously modified.

The amplification transistor ST2 includes a first electrode receiving a sensing driving voltage SLVD, a second electrode electrically connected to a second sensing node SN2, and a third electrode electrically connected to the first sensing node SN1. The amplification transistor ST2 may be turned on according to the potential of the first sensing node SN1 to apply the sensing driving voltage SLVD to the second sensing node SN2. As an example of the inventive concept, the sensing driving voltage SLVD may be one of the first driving voltage ELVDD, the first and second initialization voltages VINT1 and VINT2. When the sensing driving voltage SLVD is the first driving voltage ELVDD, the first electrode of the amplification transistor ST2 may be electrically connected to the first driving voltage line VL1. When the sensing driving voltage SLVD is the first initialization voltage VINT1, the first electrode of the amplification transistor ST2 may be electrically connected to the first initialization voltage line VL3, and when the sensing driving voltage SLVD is the second initialization voltage VINT2, the first electrode of the amplification transistor ST2 may be electrically connected to the second initialization voltage line VL4.

The output transistor ST3 includes a first electrode electrically connected to the second sensing node SN2, a second electrode electrically connected to the d-th readout line RLd, and a third electrode receiving an output control signal. The output transistor ST3 may transmit the detection signal FSd to the d-th readout line RLd in response to the output control signal. The output control signal may be the j-th write scan signal SWj supplied through the j-th write scan line SWLj. For example, the output transistor ST3 may receive the j-th write scan signal SWj supplied from the write scan line SWLj as the output control signal.

The light detection unit LSU of the sensor FX may be exposed to light during an emission section of the light emitting elements ED_R, ED_G1, ED_G2, and ED_B. The light may be light output from any one of the light emitting elements ED_R, ED_G1, ED_G2, and ED_B.

If the user's hand US_F (see FIG. 1) touches the display surface IS (see FIG. 1), the first and second light detection elements OPD1 and OPD2 may generate photocharges corresponding to light reflected by ridges or valleys between the ridges of the fingerprint, and the generated photocharges may be accumulated in the first sensing node SN1.

The amplification transistor ST2 may be a source follower amplifier that generates a source-drain current in proportion to the amount of charge of the first sensing node SN1 input to the third electrode.

During the fourth activation section AP4, the low-level j-th write scan signal SWj is supplied to the output transistor ST3 through the j-th write scan line SWLj. When the output transistor ST3 is turned on in response to the low-level j-th write scan signal SWj, the detection signal FSd corresponding to the current flowing through the amplification transistor ST2 may be output to the d-th readout line RLd.

Next, when the reset control signal RST having a high level is supplied through the reset control line RCL during a reset section, the reset transistor ST1 is turned on. The reset section may be defined as an activation section (i.e., a high level section of the reset control signal RST) of the reset control line RCL. Alternatively, when the reset transistor ST1 is formed of a PMOS transistor, the reset control signal RST having a low level may be supplied to the reset control line RCL during the reset section. During the reset section, the first sensing node SN1 may be reset to a potential corresponding to the reset voltage Vrst. As an example of the inventive concept, the reset voltage Vrst may have a lower voltage level than the second driving voltage ELVSS.

Next, when the reset section ends, the light detection unit LSU may generate photocharges corresponding to the received light, and the generated photocharges may be accumulated in the first sensing node SN1.

Figure 7:
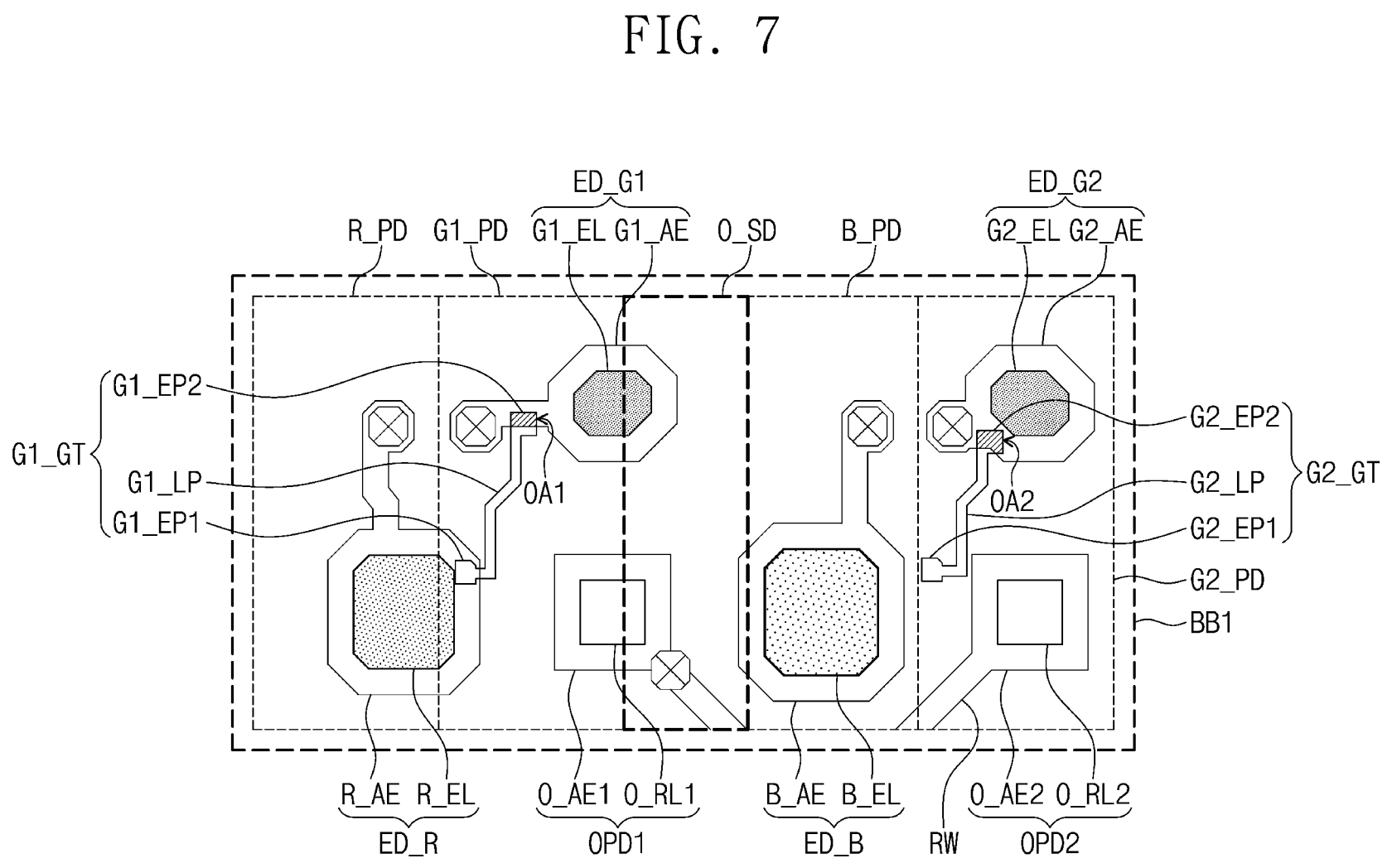
Figure 8A:
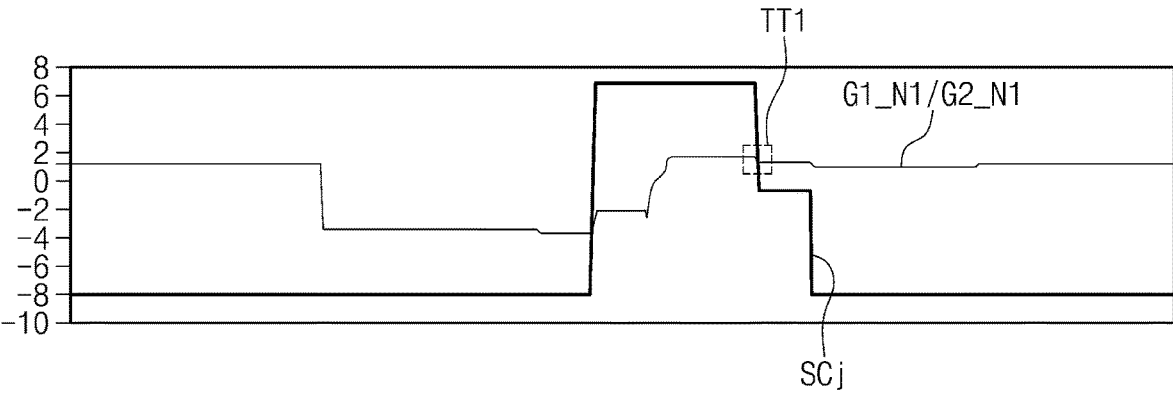
FIG. 8A is a waveform diagram illustrating the j-th compensation scan signal and the potential of the first node shown in FIG. 6A.
Figure 8B:
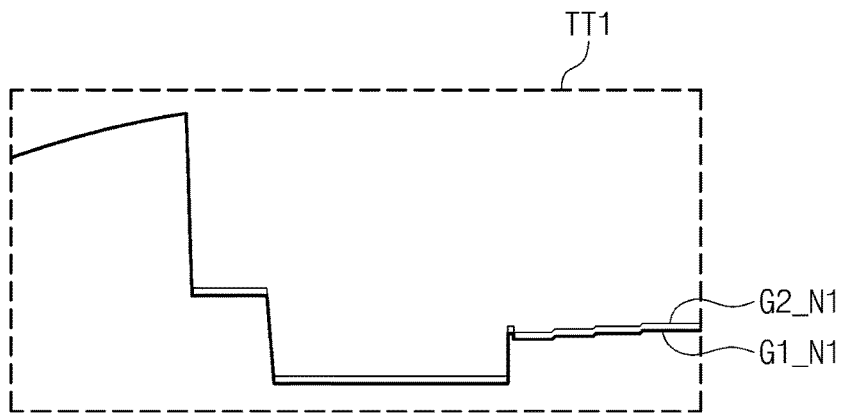
FIG. 8B is an enlarged waveform diagram of the first area TT1 illustrated in FIG. 8A.

FIG. 7 is an enlarged view of a partial area BB1 of the display panel shown in FIG. 4A according to an embodiment. FIG. 8A is a waveform diagram illustrating the j-th compensation scan signal and the potential of the first node illustrated in FIG. 6A, and FIG. 8B is an enlarged waveform diagram of the first region TT1 illustrated in FIG. 8A.

Referring to FIG. 7, the first green light emitting element ED_G1 is electrically connected to the first green pixel driving circuit G1_PD. For example, the first green light emitting element ED_G1 includes a first green anode electrode G1_AE and a first green light emitting layer G1_EL, and the first green anode electrode G1_AE is electrically connected to the first green pixel driving circuit G1_PD through a contact hole. The first green pixel driving circuit G1_PD includes the first to fifth transistors T1, T2, T3, T4, and T5 (see FIG. 6A), the first and second emission control transistors ET1 and ET2 (see FIG. 6A), and the one capacitor Cst (see FIG. 6A).

FIG. 7 illustrates the gate electrode G1_GT of the first transistor T1 included in the first green pixel driving circuit G1_PD for convenience of explanation. The gate electrode G1_GT of the first transistor T1 may include a first end portion G1_EP1, a second end portion G1_EP2, and a connection portion G1_LP connecting the first end portion G1_EP1 and the second end portion G1_EP2. The first end portion G1_EP1 may be electrically connected to the third transistor T3 and the fourth transistor T4, and the second end portion G1_EP2 may be electrically connected to the capacitor Cst. The second end portion G1_EP2 of the gate electrode G1_GT may at least partially overlap the first green anode electrode G1_AE in a plan view. An overlapping area of the second end portion G1_EP2 of the gate electrode G1_GT and the first green anode electrode G1_AE may be referred to as a first overlapping area OA1.

The second green light emitting element ED_G2 is electrically connected to the second green pixel driving circuit G2_PD. For example, the second green light emitting element ED_G2 includes a second green anode electrode G2_AE and a second green light emitting layer G2_EL, and the second green anode electrode G2_AE is electrically connected to the second green pixel driving circuit G2_PD through a contact hole. The second green pixel driving circuit G2_PD includes the first to fifth transistors T1, T2, T3, T4, and T5 (see FIG. 6A), the first and second emission control transistors ET1 and ET2 (see FIG. 6A), and the one capacitor Cst (see FIG. 6A).

FIG. 7 illustrates the gate electrode G2_GT of the first transistor T1 included in the second green pixel driving circuit G2_PD for convenience of explanation. The gate electrode G2_GT of the first transistor T1 may include a first end portion G2_EP1, a second end portion G2_EP2, and a connection portion G2_LP connecting the first end portion G2_EP1 and the second end portion G2_EP2. The first end portion G2_EP1 may be electrically connected to the third transistor T3 and the fourth transistor T4, and the second end portion G2_EP2 may be electrically connected to the capacitor Cst. The second end portion G2_EP2 of the gate electrode G2_GT may at least partially overlap the second green anode electrode G2_AE in a plan view. An overlapping area of the second end portion G2_EP2 of the gate electrode G2_GT and the second green anode electrode G2_AE may be referred to as a second overlapping area OA2.

As an example of the inventive concept, the first overlapping area OA1 may be different from the second overlapping area OA2. For example, the first overlapping area OA1 may be smaller than the second overlapping area OA2.

As an example of the inventive concept, one of the first and second green light emitting elements ED_G1 and ED_G2 may at least partially overlap the sensor driving circuit O_SD in a plan view. FIG. 7 illustrates a case in which the first green light emitting element ED_G1 at least partially the sensor driving circuit O_SD and the second green light emitting element ED_G2 does not overlap the sensor driving circuit O_SD. However, the second green light emitting element ED_G2 may at least partially overlap the sensor driving circuit O_SD and the first green light emitting element ED_G1 might not overlap the sensor driving circuit O_SD.

When the first green light emitting element ED_G1 at least partially the sensor driving circuit O_SD, an area of the first green anode electrode G1_AE may be greater than an area of the second green anode electrode G2_AE. When the second green light emitting element ED_G2 at least partially the sensor driving circuit O_SD, the area of the second green anode electrode G2_AE may be larger than that of the first green anode electrode G1_AE. The first green anode electrode G1_AE and the second green anode electrode G2_AE may have different sizes and different shapes. Due to a difference in size and shape between the first green anode electrode G1_AE and the second green anode electrode G2_AE, the first and second at least partially overlapping areas OA1 and OA2 may be different from each other.

FIG. 8A shows the j-th compensation scan signal SCj provided to the third transistor T3 and the potential at the first node N1 (refer to FIG. 6A). When the first and second green light emitting elements ED_G1 and ED_G2 are equally arranged in the j-th row, the first green pixel driving circuit G1_PD and the second green pixel driving circuit G2_PD may receive the j-th compensation scan signal SCj. Here, the potential of the first node N1 of the first green pixel driving circuit G1_PD may be referred to as "G1_N1", and the potential of the first node N1 of the second green pixel driving circuit G2_PD may be referred to as "G2_N1". The potential of the first node N1 may be decreased by coupling with the j-th compensation scan signal SCj.

As shown in FIG. 8B, when the first and second overlapping areas OA1 and OA2 are different from each other, a difference in a coupling level by the j-th compensation scan signal SCj may occur between the first and second green pixel driving circuits G1_PD and G2_PD. As a result, a deviation may occur between the potential G1_N1 of the first node N1 of the first green pixel driving circuit G1_PD and the potential G2_N1 of the first node N1 of the second green pixel driving circuit G2_PD.

As an example of the inventive concept, when the first and second overlapping areas OA1 and OA2 are different from each other, a deviation between the potentials G1_N1 and G2_N1 of the first node N1 is about 0.008V to about 0.011V. Due to the potential deviation of the first node N1, a luminance deviation may occur between the first and second green light emitting elements ED_G1 and ED_G2.

Figure 9:
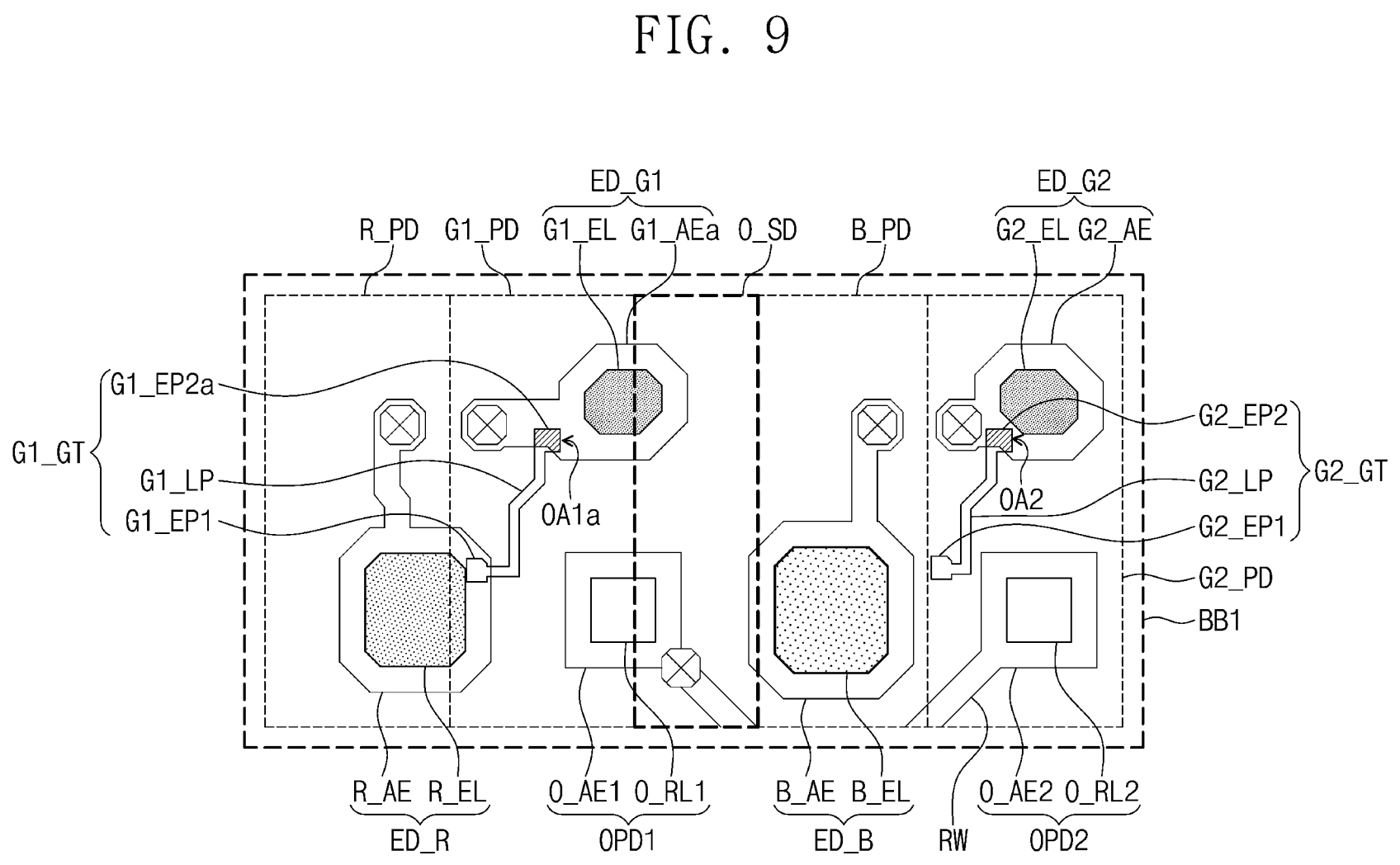
Figure 10A:
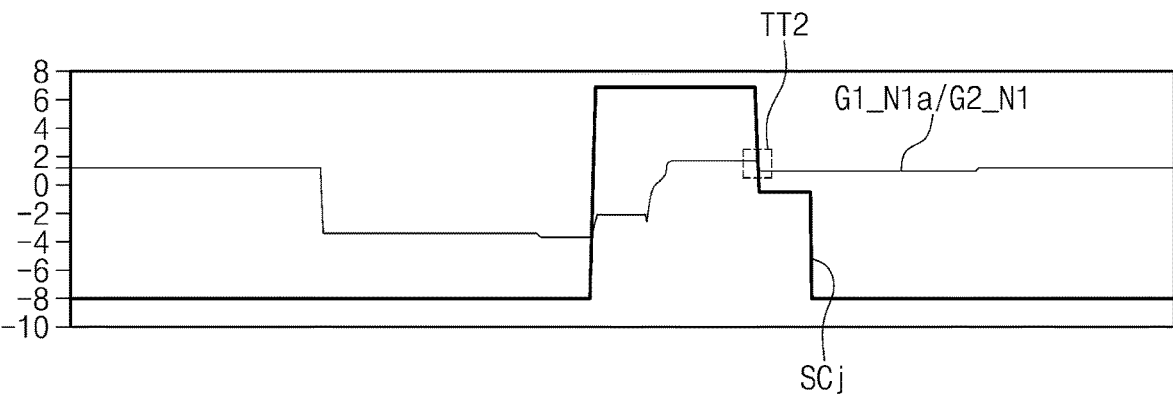
FIG. 10A is a waveform diagram illustrating the j-th compensation scan signal and the potential of the first node shown in FIG. 6A.
Figure 10B:
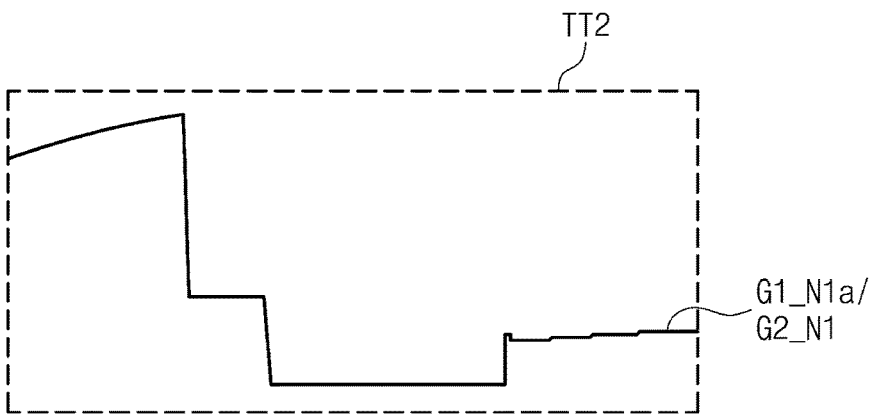
FIG. 10B is an enlarged waveform diagram of the second area TT2 illustrated in FIG. 10A.

FIG. 9 is an enlarged view of a partial area BB1 of the display panel shown in FIG. 4A according to an embodiment. FIG. 10A is a waveform diagram illustrating the first scan signal and the potential of the first node illustrated in FIG. 6A, and FIG. 10B is an enlarged waveform diagram of the second region illustrated in FIG. 10A.

Referring to FIG. 9, the first green anode electrode G1_AEa and the second green anode electrode G2_AE may have different sizes and different shapes.

In the first green pixel driving circuit G1_PD, the gate electrode G1_GT of the first transistor T1 may include a first end G1_EP1, a second end G1_EP2a, and a connection part G1_LP connecting the first end G1_EP1 and the second end G1_EP2a. The second end G1_EP2a of the gate electrode G1_GT may at least partially overlap the first green anode electrode G1_AEa in a plan view forming a first overlapping area OA1a.

In the second green pixel driving circuit G2_PD, the gate electrode G2_GT of the first transistor T1 may include a first end G2_EP1, a second end G2_EP2, and a connection part G2_LP connecting the first end G2_EP1 and the second end G2_EP2. The second end G2_EP2 of the gate electrode G2_GT may at least partially overlap the second green anode electrode G2_AE forming a second overlapping area OA2 in a plan view.

As an example of the inventive concept, although the size and shape of the first green anode electrode G1_AEa are different from the size and shape of the second green anode electrode G2_AE, the first and second overlapping areas OA1a and OA2 may be the same. In order to make the first overlapping area OA1a and the second overlapping area OA2 equal to each other, the shape of the first green anode electrode G1_Aea shown in FIG. 9 may be changed to be different from the shape of the first green anode electrode G1_AE shown in FIG. 7. By changing the shape and size of the first green anode electrode G1_Aea, the first overlapping area OA1a may be equal to the second overlapping area OA2. Here, the shape of the second end G1_EP2a of the gate electrode G1_GT might not vary compared to the shape of the second end G1_EP2 of the gate electrode G1_GT illustrated in FIG. 7.

Referring to FIGS. 6A, 9, 10A and 10B, when the first and second green light emitting elements ED_G1 and ED_G2 are equally arranged in the j-th row, the first green pixel driving circuit G1_PD and the second green pixel driving circuit G2_PD may receive the j-th compensation scan signal SCj. Here, the potential of the first node N1 of the first green pixel driving circuit G1_PD may be referred to as "G1_N1a", and the potential of the first node N1 of the second green pixel driving circuit G2_PD may be referred to as "G2_N1". The potential of the first node N1 may be decreased by coupling with the j-th compensation scan signal SCj.

As shown in FIG. 10B, when the first and second overlapping areas OA1a and OA2 are equal to each other, there may be little difference in a coupling level by the j-th compensation scan signal SCj between the first and second green pixel driving circuits G1_PD and G2_PD. As a result, there may be little deviation even between the potential G1_N1a of the first node N1 of the first green pixel driving circuit G1_PD and the potential G2_N1 of the first node N1 of the second green pixel driving circuit G2_PD.

As an example of the inventive concept, when the first and second overlapping areas OA1a and OA2 are equal to each other, the deviation between the potentials G1_N1a and G2_N1 of the first node N1 is about 0.001V to about 0.002V. As such, when the potential deviation of the first node N1 is reduced, a luminance deviation between the first and second green light emitting elements ED_G1 and ED_G2 might not substantially occur. Accordingly, the overall image quality of the display panel DP may be increased.

Figure 11A:
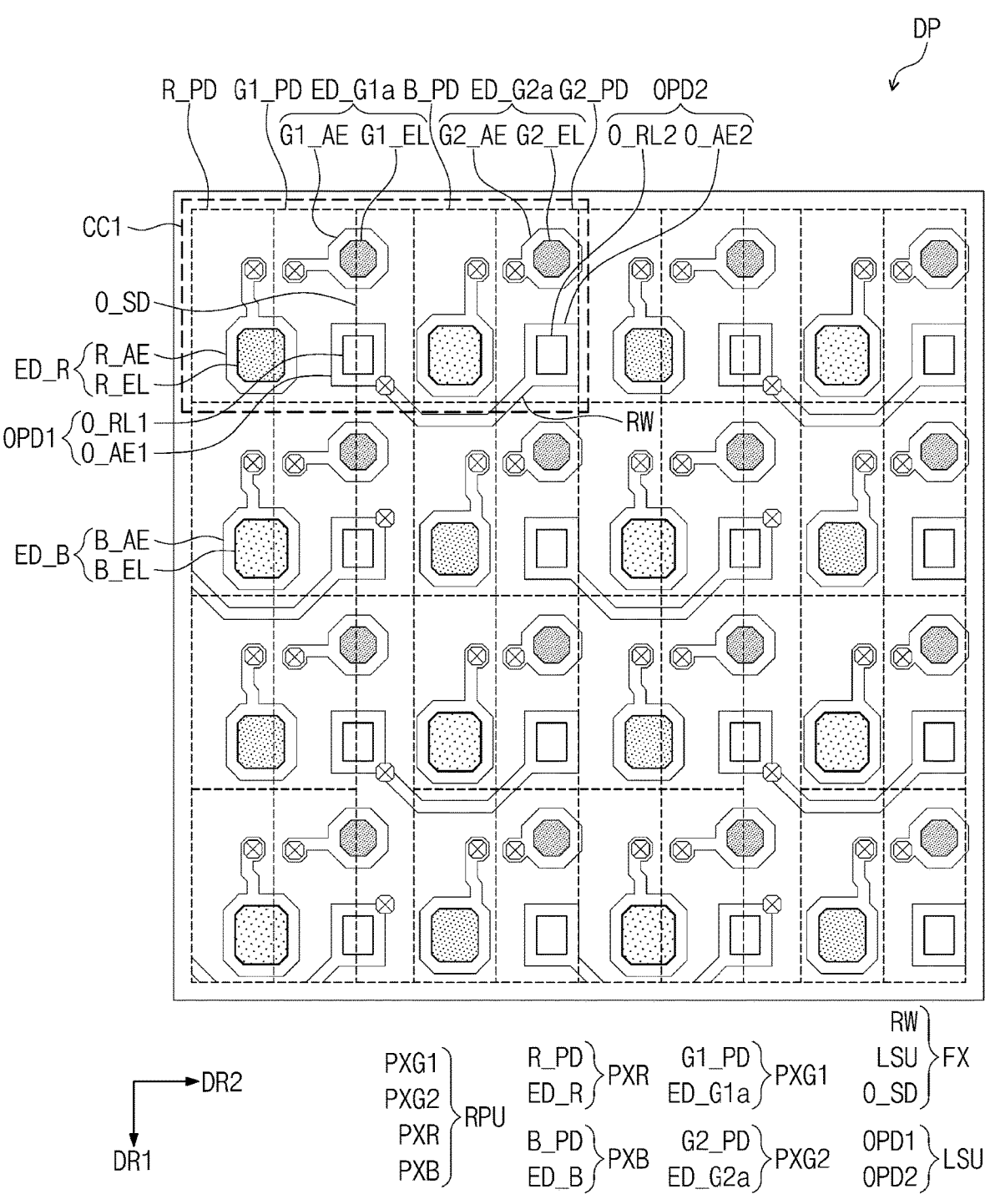
FIG. 11A is an enlarged plan view of a partial area of a display panel according to an embodiment.
Figure 11B:
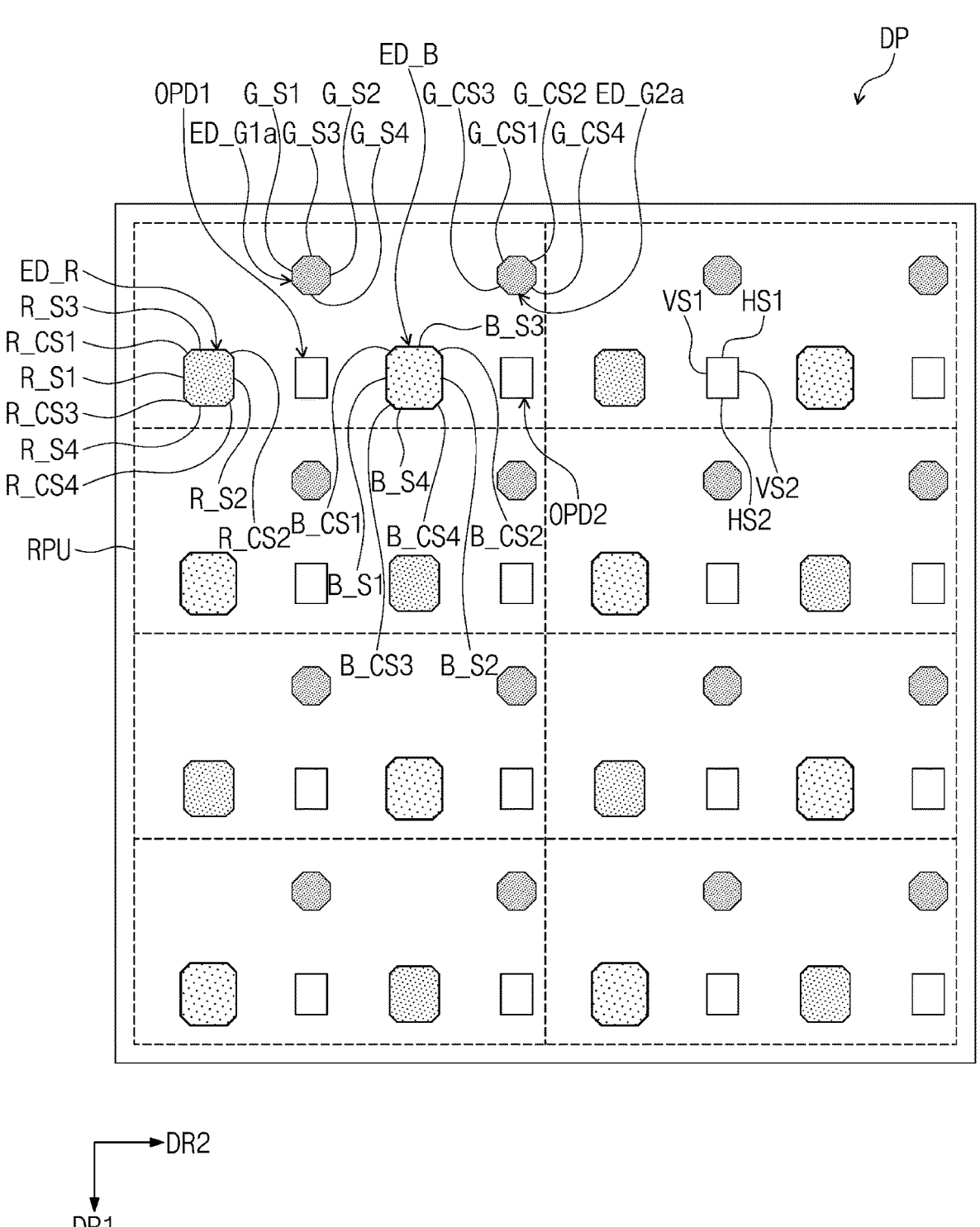
FIG. 11B is a plan view illustrating the light emitting layers shown in FIG. 11A.
Figure 12A:
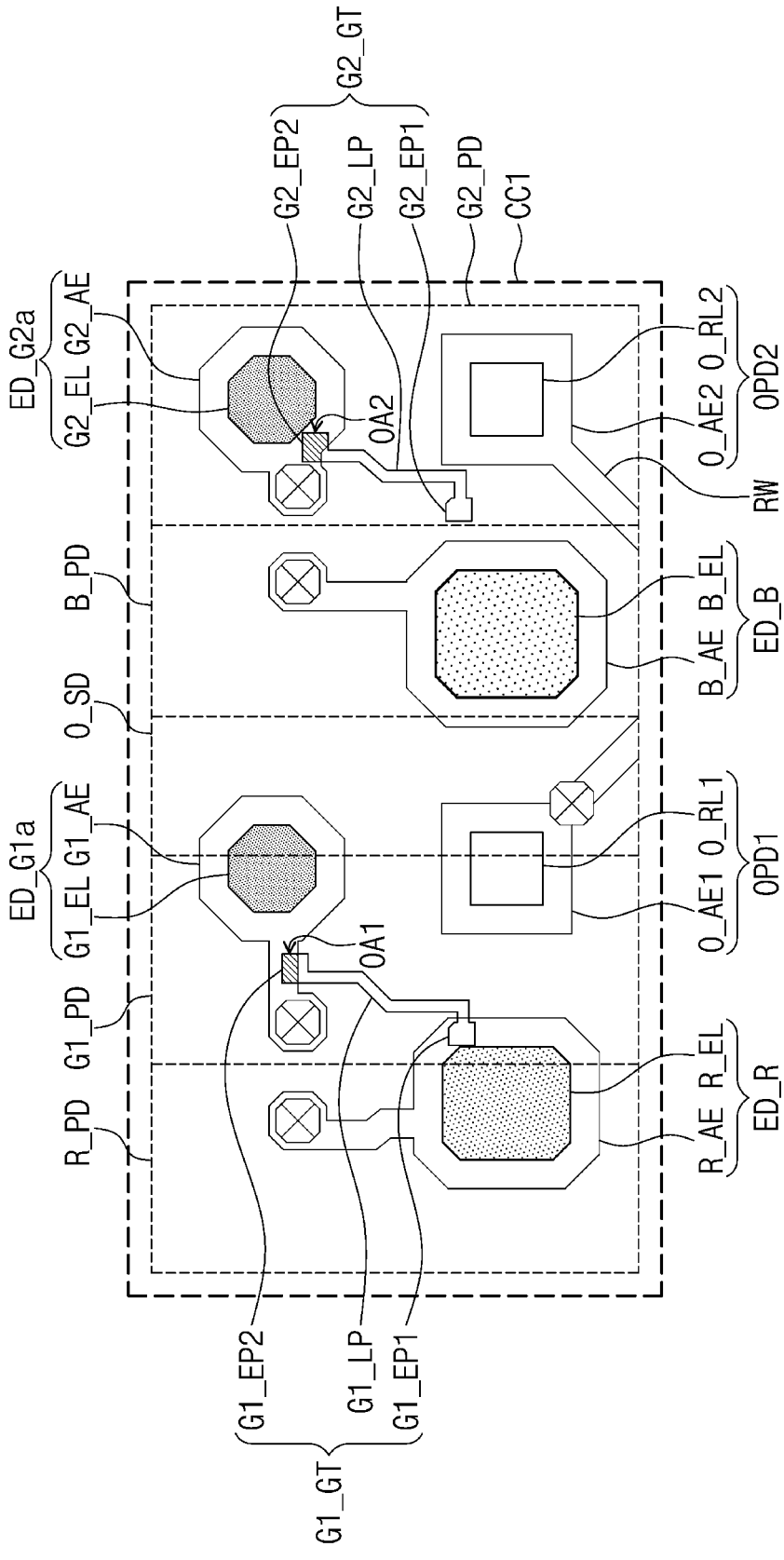
FIG. 12A is an enlarged view of a partial area CC1 of the display panel shown in FIG. 11A according to an embodiment.
Figure 12B:
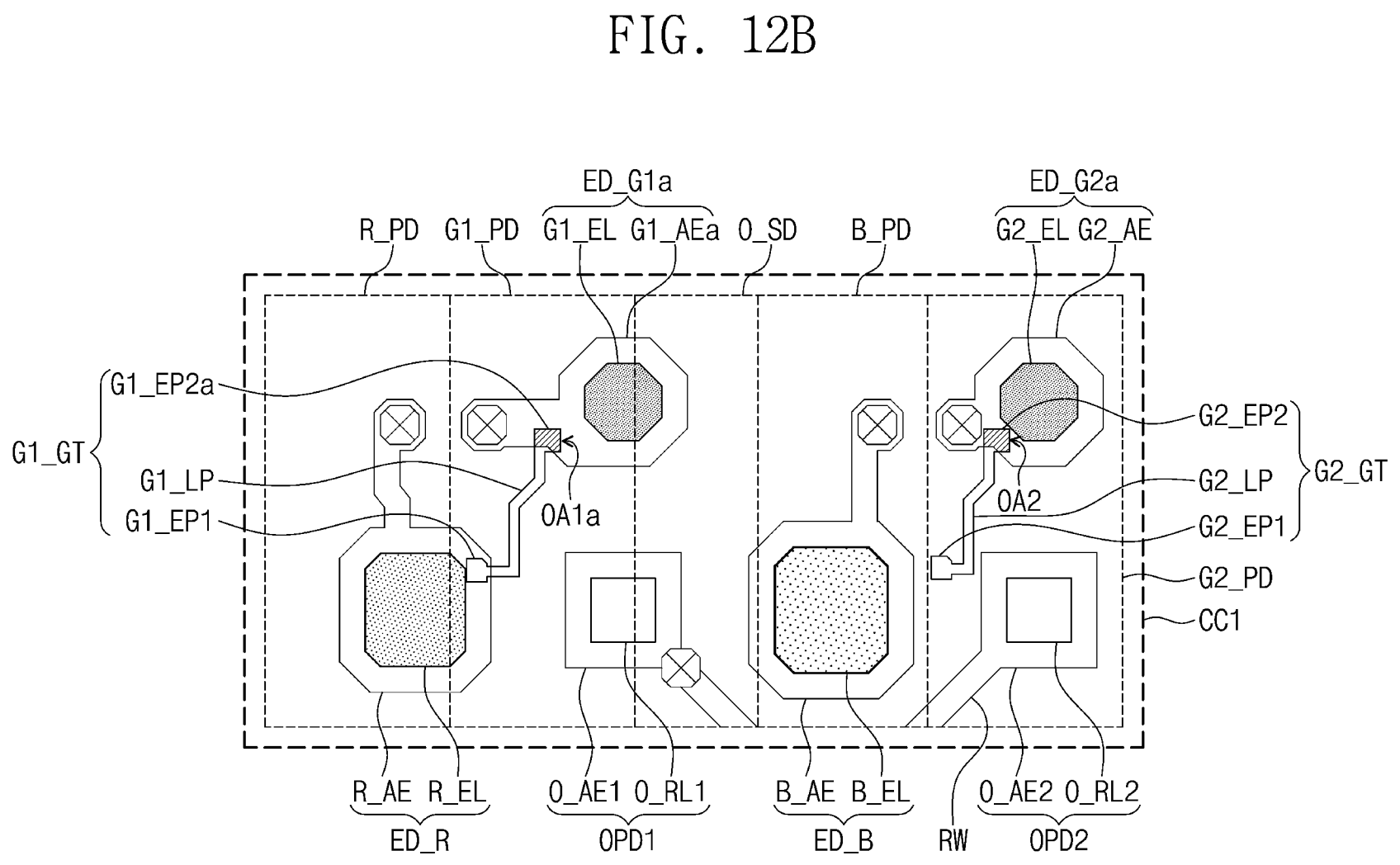

FIG. 11A is an enlarged plan view of a partial region of a display panel according to an embodiment, and FIG. 11B is a plan view illustrating the light emitting layers shown in FIG. 11A. FIG. 12A is an enlarged view of a partial area CC1 of the display panel shown in FIG. 11A according to an embodiment, and FIG. 12B is an enlarged view of a partial area CC1 of the display panel shown in FIG. 11A according to an embodiment. However, among the components illustrated in FIG. 11A, the same reference numerals are used for the same components as those illustrated in FIG. 4A, and to the extent that description of various elements has been omitted, those elements may be at least similar to corresponding elements that have been described elsewhere within the specification.

Referring to FIGS. 11A and 11B, the first and second green light emitting elements ED_G1$a$ and ED_G2$a$ may have the same size and the same shape. As an example of the inventive concept, each of the first and second green light emitting elements ED_G1$a$ and ED_G2$a$ may have an octagonal shape having the same length in the first direction DR1 and the second direction DR2. However, the inventive concept is not necessarily limited thereto. For example, each of the first and second green light emitting elements ED_G1$a$ and ED_G2$a$ may have one of a square shape and a rectangular shape.

Each of the first and second green light emitting layers G1_EL and G2_EL may include first and second sides G_S1 and G_S2 extending in the first direction DR1, third and fourth sides G_S3 and G_S4 extending in the second direction DR2, and first to fourth inclined sides G_CS1, G_CS2, G_CS3, and G_CS4 inclined with respect to the first and second directions DR1 and DR2. The lengths of the first and second sides G_S1 and G_S2 may be the same as the lengths of the third and fourth sides G_S3 and G_S4.

The first and fourth inclined sides G_CS1 and G_CS4 face each other and the second and third inclined sides G_CS2 and G_CS3 face each other. The lengths of the first to fourth inclined sides G_CS1 to G_CS4 may be the same.

The shape of the emission area of the first and second green light emitting elements ED_G1 and ED_G2 may be defined by the shape of each of the first and second green light emitting layers G1_EL and G2_EL. Accordingly, the shape of the first green light emitting layer G1_EL may be referred to as the shape of the emission area of the first green light emitting element ED_G1$a$ or the shape of the first green light emitting element ED_G1$a$, and the shape of each of the second green light emitting layers G2_EL may be referred to as the shape of the emission area of the second green light emitting element ED_G2$a$ or the shape of the second green light emitting element ED_G2$a$. As an example of the inventive concept, the first and second green light emitting layers G1_EL and G2_EL may have the same size and the same shape.

The first and second photoelectric conversion layers O_RL1 and O_RL2 have the same shape. The first and second photoelectric conversion layers O_RL1 and O_RL2 may have different shapes from the red and blue light emitting layers R_EL and B_EL. As an example of the inventive concept, each of the first and second photoelectric conversion layers O_RL1 and O_RL2 may have a rectangular shape. The shapes of the light receiving areas of the first and second light detection elements OPD1 and OPD2 may be defined by the shapes of the first and second photoelectric conversion layers O_RL1 and O_RL2, respectively. Accordingly, the shape of the first photoelectric conversion layer O_RL1 may be referred to as the shape of the light receiving area of the first light detection element OPD1 or the shape of the first light detection element OPD1, and the shape of the second photoelectric conversion layer O_RL2 may be referred to as the shape of the light receiving area of the second light detection element OPD2 or the shape of the second light detection element OPD2.

Each of the first and second photoelectric conversion layers O_RL1 and O_RL2 includes first and second vertical sides VS1 and VS2 extending in the first direction DR1 and first and second horizontal sides HS1 and HS2 extending in the second direction DR2. As an example, lengths of the first and second vertical sides VS1 and VS2 may be different from lengths of the first and second horizontal sides HS1 and HS2. For example, lengths of the first and second vertical sides VS1 and VS2 may be greater than lengths of the first and second horizontal sides HS1 and HS2.

Referring to FIG. 12A, the gate electrode G1_GT of the first transistor T1 (refer to FIG. 6A) included in the first green pixel driving circuit G1_PD may include a first end G1_EP1, a second end G1_EP2, and a connection part G1_LP connecting the first end G1_EP1 and the second end G1_EP2. The second end G1_EP2 of the gate electrode G1_GT may at least partially overlap the first green anode electrode G1_Aea in a plan view forming a first overlapping area OA1.

The gate electrode G2_GT of the first transistor T1 in the second green pixel driving circuit G2_PD may include a first end G2_EP1, a second end G2_EP2, and a connection part G2_LP connecting the first end G2_EP1 and the second end G2_EP2. The second end G2_EP2 of the gate electrode G2_GT may at least partially overlap the second green anode electrode G2_AE forming a second overlapping area OA2 in a plan view. As an example of the inventive concept, the first overlapping area OA1 may be different from the second overlapping area OA2. For example, the first overlapping area OA1 may be smaller than the second overlapping area OA2.

As an example of the inventive concept, one of the first and second green light emitting elements ED_G1$a$ and ED_G2$a$ may at least partially overlap the sensor driving circuit O_SD in a plan view. FIG. 12A illustrates a case in which the first green light emitting element ED_G1$a$ at least partially the sensor driving circuit O_SD and the second green light emitting element ED_G2$a$ does not overlap the sensor driving circuit O_SD. However, the second green light emitting element ED_G2$a$ may at least partially overlap the sensor driving circuit O_SD and the first green light emitting element ED_G1$a$ might not overlap the sensor driving circuit O_SD.

When the first green light emitting element ED_G1$a$ at least partially overlaps the sensor driving circuit O_SD, an area of the first green anode electrode G1_AE may be greater than an area of the second green anode electrode G2_AE. When the second green light emitting element ED_G2 at least partially overlaps the sensor driving circuit O_SD, the area of the second green anode electrode G2_AE may be larger than that of the first green anode electrode G1_AE. The first green anode electrode G1_AE and the second green anode electrode G2_AE may have different sizes and different shapes. Due to a difference in size and shape between the first green anode electrode G1_AE and the second green anode electrode G2_AE, the first and second overlapping areas OA1 and OA2 may be different from each other.

The first green anode electrode G1_AE and the second green anode electrode G2_AE may have different sizes and different shapes. However, although the size and shape of the first green anode electrode G1_AE are different from the size and shape of the second green anode electrode G2_AE, the first and second overlapping areas OA1 and OA2 may be the same.

Referring to FIG. 12B, in the first green pixel driving circuit G1_PD, the gate electrode G1_GT of the first transistor T1 (refer to FIG. 6A) may include a first end G1_EP1, a second end G1_EP2a, and a connection part G1_LP connecting the first end G1_EP1 and the second end G1_EP2a. The second end G1_EP2a of the gate electrode G1_GT may at least partially overlap the first green anode electrode G1_AE in a plan view forming a first overlapping area OA1a.

In the second green pixel driving circuit G2_PD, the gate electrode G2_GT of the first transistor T1 may include a first end G2_EP1, a second end G2_EP2, and a connection part G2_LP connecting the first end G2_EP1 and the second end G2_EP2. The second end G2_EP2 of the gate electrode G2_GT may at least partially overlap the second green anode electrode G2_AE forming a second overlapping area OA2 in a plan view.

As an example of the inventive concept, the first overlapping area OA1a may be the same as the second overlapping area OA2. In order to make the first overlapping area OA1a and the second overlapping area OA2 equal to each other, the shape of the first green anode electrode G1_Aea shown in FIG. 12B may be changed to be different from the shape of the first green anode electrode G1_AE shown in FIG. 12A. By changing the shape and size of the first green anode electrode G1_Aea, the first overlapping area OA1a may be equal to the second overlapping area OA2. Here, the size and shape of the second end G1_EP2a of the gate electrode G1_GT may be the same as the size and shape of the second end G1_EP2 of the gate electrode G1_GT shown in FIG. 12A.

As such, when the first and second overlapping areas OA1a and OA2 are equal to each other, a luminance deviation between the first and second green light emitting elements ED_G1 and ED_G2 may be prevented from occurring. Accordingly, the overall image quality of the display panel DP may be increased.

Figure 13:
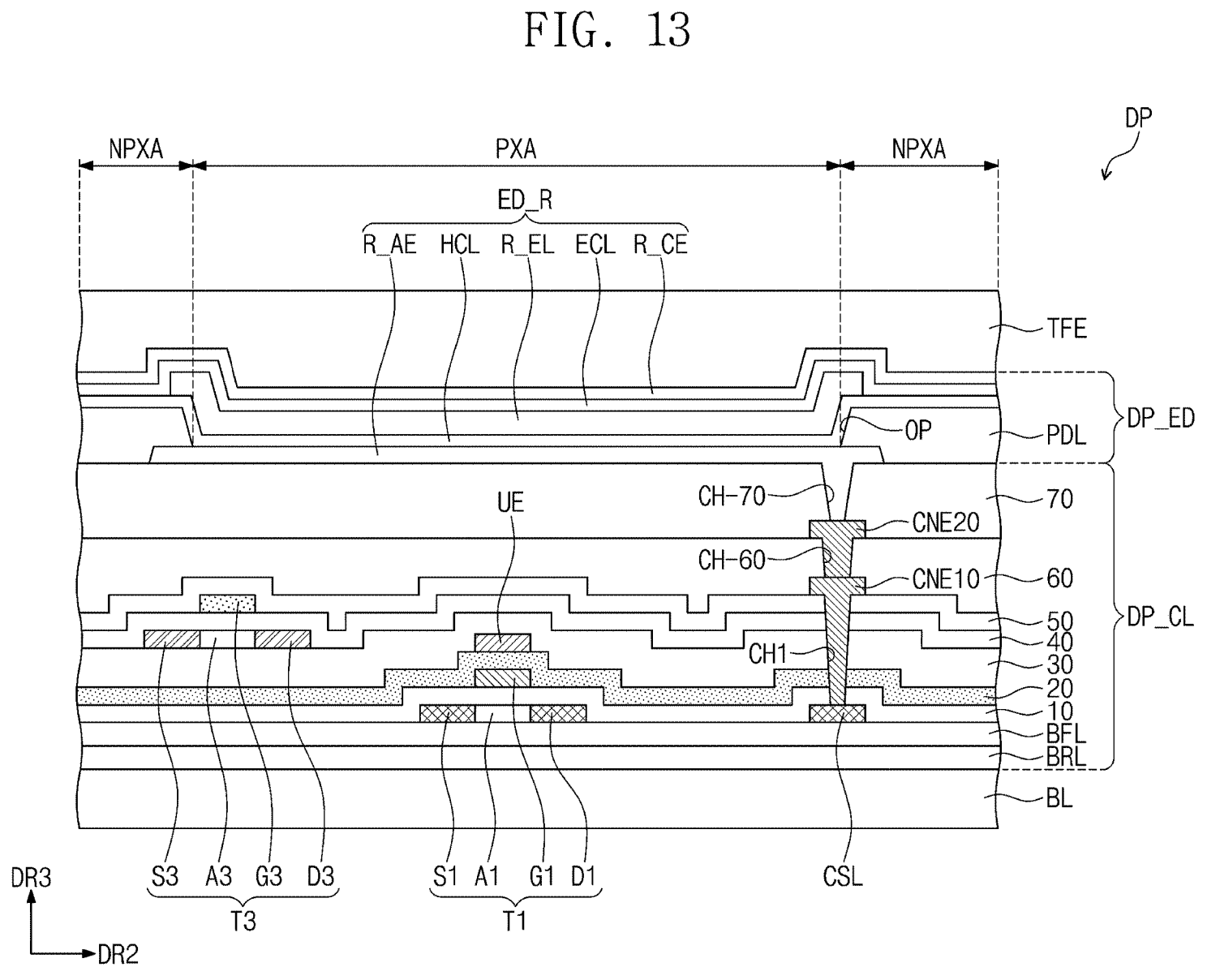
Figure 14A:
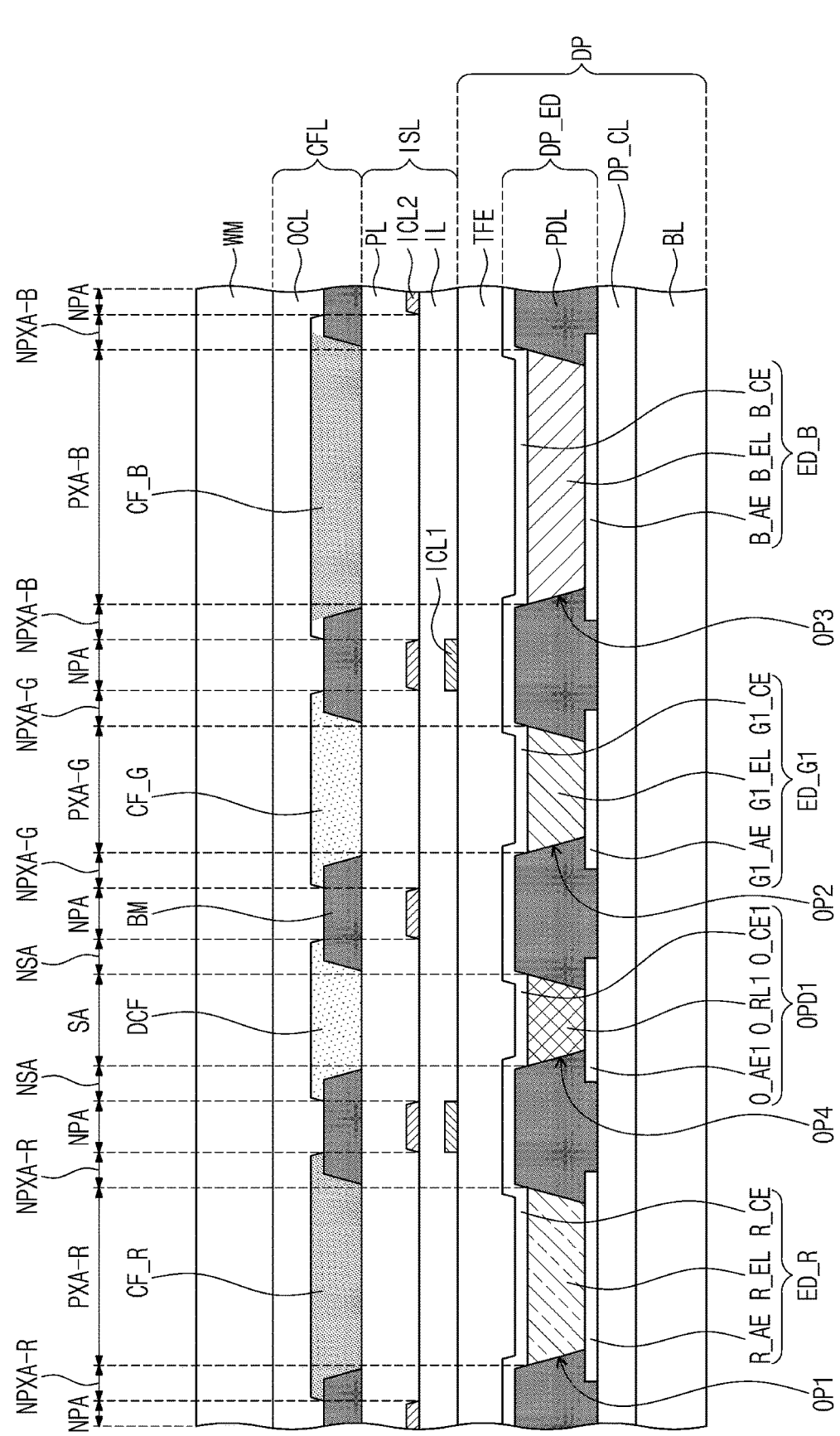
FIGS. 14A and 14B are cross-sectional views illustrating a light emitting element and a light detection element of a display panel according to an embodiment.
Figure 14B:
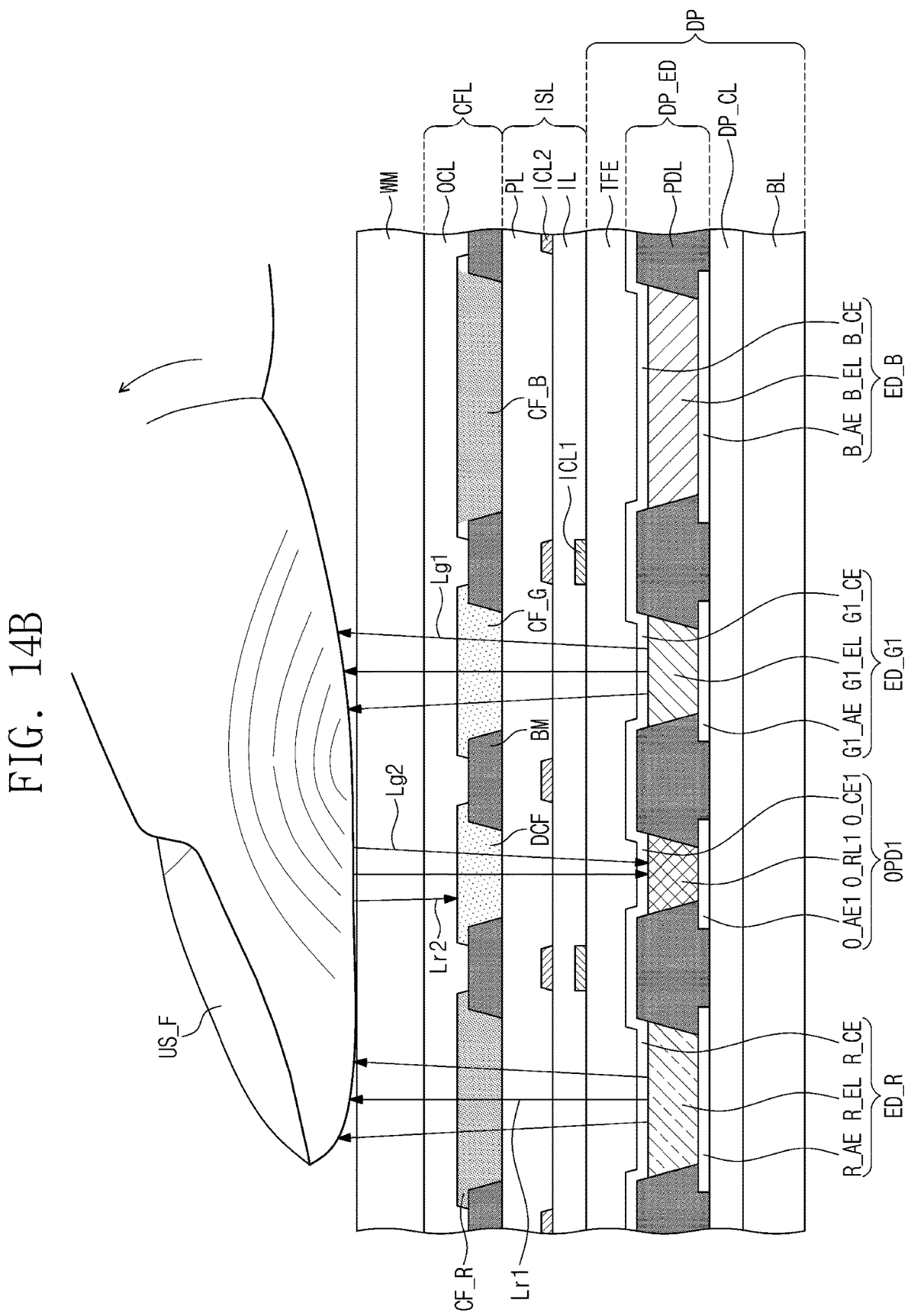

FIG. 13 is a cross-sectional view illustrating a pixel of a display panel according to an embodiment, and FIGS. 14A and 14B are cross-sectional views illustrating a light emitting element and a light detection element of a display panel according to an embodiment.

Referring to FIGS. 13 and 14A, the display panel DP may include a base layer BL, a circuit layer DP_CL disposed on the base layer BL, an element layer DP_ED, and an encapsulation layer TFE.

The base layer BL may include a synthetic resin layer. The synthetic resin layer may include a thermosetting resin. Especially, the synthetic resin layer may be a polyimide resin layer, and the material thereof is not particularly limited thereto. The synthetic resin layer may include an acrylic resin, a methacrylic resin, a polyisoprene, a vinyl resin, an epoxy resin, a urethane resin, a cellulose resin, a siloxane resin, a polyamide resin, and/or a perylene resin. In addition, the base layer BL may include a glass substrate, a metal substrate, or an organic/inorganic composite material substrate.

At least one inorganic layer is formed on the upper surface of the base layer BL. The inorganic layer may include aluminum oxide, titanium oxide, silicon oxide silicon oxynitride, zirconium oxide, and/or hafnium oxide. The inorganic layer may be formed in multiple layers. The multi-layered inorganic layers may constitute a barrier layer BRL and/or a buffer layer BFL, which are described below. The barrier layer BRL and the buffer layer BFL may be selectively disposed.

The barrier layer BRL prevents foreign substances from being introduced from the outside. The barrier layer BRL may include a silicon oxide layer and a silicon nitride layer. Each of these may be provided in plurality, and silicon oxide layers and silicon nitride layers may be alternately stacked.

The buffer layer BFL may be disposed on the barrier layer BRL. The buffer layer BFL increases the bonding force between the base layer BL and the semiconductor pattern and/or the conductive pattern. The buffer layer BFL may include a silicon oxide layer and a silicon nitride layer. The silicon oxide layer and the silicon nitride layer may be alternately stacked.

A semiconductor pattern is disposed on the buffer layer BFL. Hereinafter, a semiconductor pattern directly disposed on the buffer layer BFL is defined as a first semiconductor pattern. The first semiconductor pattern may include a silicon semiconductor. The first semiconductor pattern may include polysilicon. However, the inventive concept is not necessarily limited thereto, and the first semiconductor pattern may include amorphous silicon.

FIG. 13 only illustrates a portion of the first semiconductor pattern, and a first semiconductor pattern may be further disposed in another area of the pixel PXR (refer to FIG. 6A). The first semiconductor pattern has different electrical properties depending on whether it is doped or not. The first semiconductor pattern may include a doped area and a non-doped area. The doped area may be doped with an N-type dopant or a P-type dopant. The P-type transistor includes a doped area doped with a P-type dopant, and the N-type transistor includes a doped area doped with an N-type dopant.

The doped area is more conductive than the non-doped area, and substantially serves as an electrode or signal line. The non-doped area actually corresponds to the active (or channel) of the transistor. For example, a portion of the first semiconductor pattern may be an active transistor, another portion may be a source or drain of the transistor, and another portion may be a connection signal line (or a connection electrode).

As shown in FIG. 13, the first electrode S1, the channel portion A1, and the second electrode D1 of the first transistor T1 are formed from the first semiconductor pattern. The first electrode S1 and the second electrode D1 of the first transistor T1 extend in opposite directions from the channel part A1.

FIG. 13 illustrates a part of a connection signal line CSL formed from a semiconductor pattern. The connection signal line CSL may be electrically connected to the second electrode of the second emission control transistor ET2 (refer to FIG. 6A) in a plan view.

The first insulating layer 10 is disposed on the buffer layer BFL. The first insulating layer 10 at least partially overlaps the plurality of pixels PX (refer to FIG. 3) in common and covers the first semiconductor pattern. The first insulating layer 10 may be an inorganic layer and/or an organic layer, and may have a single layer or multilayer structure. The first insulating layer 10 may include aluminum oxide, titanium oxide, silicon oxide, silicon oxynitride, zirconium oxide, and/or hafnium oxide. In this embodiment, the first insulating layer 10 may be a single-layer silicon oxide layer. In addition to the first insulating layer 10, the insulating layer of the circuit layer DP_CL to be described later may be an inorganic layer and/or an organic layer, and may have a single layer or multilayer structure. The inorganic layer may include at least one of the above-mentioned materials.

The third electrode G1 of the first transistor T1 is disposed on the first insulating layer 10. The third electrode G1 may be a part of the metal pattern. The third electrode G1 of the first transistor T1 at least partially overlaps the channel part A1 of the first transistor T1. In the process of doping the first semiconductor pattern, the third electrode G1 of the first transistor T1 may function as a mask.

A second insulating layer 20 covering the third electrode G1 is disposed on the first insulating layer 10. The second insulating layer 20 at least partially overlaps the plurality of pixels PX in common. The second insulating layer 20 may be an inorganic layer and/or an organic layer, and may have a single layer or multilayer structure. In this embodiment, the second insulating layer 20 may be a single-layer silicon oxide layer.

The upper electrode UE may be disposed on the second insulating layer 20. The upper electrode UE may at least partially overlap the third electrode G1. The upper electrode UE may be a part of a metal pattern or a part of a doped semiconductor pattern. A portion of the third electrode G1 and the upper electrode UE at least partially overlapping the portion may define a capacitor Cst (refer to FIG. 6A). In an embodiment of the inventive concept, the upper electrode UE may be omitted.

In an embodiment of the inventive concept, the second insulating layer 20 may be replaced with an insulating pattern. The upper electrode UE is disposed on the insulating pattern. The upper electrode UE may serve as a mask for forming an insulating pattern from the second insulating layer 20.

A third insulating layer 30 covering the upper electrode UE is disposed on the second insulating layer 20. In this embodiment, the third insulating layer 30 may be a single-layer silicon oxide layer. A semiconductor pattern is disposed on the third insulating layer 30. Hereinafter, the semiconductor pattern directly disposed on the third insulating layer 30 is defined as a second semiconductor pattern. The second semiconductor pattern may include a metal oxide. The oxide semiconductor may include a crystalline or amorphous oxide semiconductor. For example, the oxide semiconductor may include a metal oxide of zinc (Zn), indium (In), gallium (Ga), tin (Sn), and titanium (T1), or a mixture of metals such as zinc (Zn), indium (In), gallium (Ga), tin (Sn), and titanium (T1) and an oxide thereof. Oxide semiconductors may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), and the like.

FIG. 13 only illustrates a portion of the second semiconductor pattern, and a second semiconductor pattern may be further disposed in another area of the pixel PXR (refer to FIG. 6A). The second semiconductor pattern may include a plurality of areas divided according to whether or not the metal oxide is reduced. The area in which the metal oxide is reduced (hereinafter, the reduction area) has higher conductivity than the area in which the metal oxide is not reduced (hereinafter, the non-reduction area). The reduction area has substantially the role of an electrode or a signal line. The non-reduction area substantially corresponds to the channel part of the transistor. For example, a portion of the second semiconductor pattern may be a channel part of the transistor, and the other portion may be a first electrode or a second electrode of the transistor.

As shown in FIG. 13, the first electrode S3, the channel part A3, and the second electrode D3 of the third transistor T3 are formed from the second semiconductor pattern. The first electrode S3 and the second electrode D3 include metal reduced from the metal oxide semiconductor. The first electrode S3 and the second electrode D3 may have a predetermined thickness from an upper surface of the second semiconductor pattern and include a metal layer including the reduced metal.

A fourth insulating layer 40 covering the second semiconductor pattern is disposed on the third insulating layer 30. In this embodiment, the fourth insulating layer 40 may be a single-layer silicon oxide layer. The third electrode G3 of the third transistor T3 is disposed on the third insulating layer 30. The third electrode G3 may be a part of the metal pattern. The third electrode G3 of the third transistor T3 at least partially overlaps the channel part A3 of the third transistor T3.

In an embodiment of the inventive concept, the fourth insulating layer 40 may be replaced with an insulating pattern. The third electrode G3 of the third transistor T3 is disposed on the insulating pattern. In the present embodiment, the third electrode G3 may have the same shape as the insulating pattern in a plan view. In this embodiment, one third electrode G3 is illustrated for convenience of description, but the third transistor T3 may include two third electrodes.

A fifth insulating layer 50 covering the third electrode G3 is disposed on the fourth insulating layer 40. In this embodiment, the fifth insulating layer 50 may include a silicon oxide layer and a silicon nitride layer. The fifth insulating layer 50 may include a plurality of silicon oxide layers and silicon nitride layers that are alternately stacked.

The first electrode and the second electrode of the fourth transistor T4 (refer to FIG. 6A) may be formed through the same process as the first electrode S3 and the second electrode D3 of the third transistor T3. In addition, the first and second electrodes of the reset transistor ST1 (see FIG. 6A), and the first and second electrodes of the output transistor ST3 (see FIG. 6A) of the sensor FX (see FIG. 6A) may be simultaneously formed through the same process as that of the first electrode S3 and the second electrode D3 of the third transistor T3.

At least one insulating layer is further disposed on the fifth insulating layer 50. As in the present embodiment, the sixth insulating layer 60 and the seventh insulating layer 70 may be disposed on the fifth insulating layer 50. The sixth insulating layer 60 and the seventh insulating layer 70 may be organic layers, and may have a single-layer or multi-layer structure. The sixth insulating layer 60 and the seventh insulating layer 70 may be a single polyimide-based resin layer. However, the embodiment of the inventive concept is not necessarily limited thereto, and the sixth insulating layer 60 and the seventh insulating layer 70 may include acrylic resin, methacrylic resin, polyisoprene, vinyl-based resin, epoxy-based resin, urethane-based resin, cellulose-based resin, siloxane-based resin, polyamide-based resin, and/or perylene-based resin.

A first connection electrode CNE10 may be disposed on the fifth insulating layer 50. The first connection electrode CNE10 may be electrically connected to the connection signal line CSL through the first contact hole CH1 penetrating the first to fifth insulating layers 10 to 50, and the second connection electrode CNE20 may be electrically connected to the first connection electrode CNE10 through a contact hole CH-60 passing through the sixth insulating layer 60. In an embodiment of the inventive concept, at least one of the fifth insulating layer 50 to the seventh insulating layer 70 may be omitted.

The element layer DP_ED includes a red light emitting element ED_R and a pixel defining film PDL. The red anode electrode R_AE of the red light emitting element ED_R is disposed on the seventh insulating layer 70. The red anode electrode R_AE of the red light emitting element ED_R may be electrically connected to the second connection electrode CNE20 through the contact hole CH-70 penetrating the seventh insulating layer 70.

An opening part OP of the pixel defining film PDL exposes at least a portion of the red anode electrode R_AE of the red light emitting element ED_R. The opening part OP of a pixel defining film PDL may define an emission area PXA. For example, the plurality of pixels PX (refer to FIG. 3) may be disposed on a plane of the display panel DP (refer to FIG. 3) in a regular manner. An area in which the plurality of pixels PX are disposed may be defined as a pixel area, and one pixel area may include an emission area PXA and a non-emission area NPXA adjacent to the emission area PXA. The non-emission area NPXA may at least partially surround the emission area PXA.

A hole control layer HCL may be commonly disposed in the emission area PXA and the non-emission area NPXA. A common layer such as the hole control layer HCL may be commonly formed in the plurality of pixels PX. The hole control layer HCL may include a hole transport layer and a hole injection layer.

A red light emitting layer R_EL is disposed on the hole control layer HCL. The red light emitting layer R_EL may be disposed only in an area corresponding to the opening part OP. The red light emitting layer R_EL may be separately formed in each of the plurality of pixels PX.

Although the patterned red light emitting layer R_EL has been exemplarily illustrated in this embodiment, the inventive concept is not necessarily limited thereto. A common light emitting layer may be commonly disposed on the plurality of pixels PX. In this case, the common light emitting layer may generate white light or blue light.

An electron control layer ECL is disposed on the red light emitting layer R_EL. The electron control layer ECL may include an electron transport layer and an electron injection layer. A cathode electrode R_CE of a red light emitting element ED_R is disposed on an electron control layer ECL. The electron control layer ECL and the cathode electrode R_CE are commonly disposed in the plurality of pixels PX.

An encapsulation layer TFE is disposed on the cathode electrode R_CE. The encapsulation layer TFE may cover the plurality of pixels PX. In this embodiment, the encapsulation layer TFE directly covers the cathode electrode R_CE. In an embodiment of the inventive concept, the display panel DP may further include a capping layer directly covering the cathode electrode R_CE. In an embodiment of the inventive concept, the stacked structure of the red light emitting element ED_R may have a vertically inverted structure from the structure shown in FIG. 13.

Referring to FIGS. 14A and 14B, a first electrode layer is disposed on the element layer DP_CL. The pixel defining film PDL is formed on the first electrode layer. The first electrode layer may include red, green, and blue anode electrodes R_AE, G_AE1, and B_AE. The first to third opening parts OP1, OP2, OP3 of the pixel defining film PDL expose at least a portion of the red, green and blue anode electrodes R_AE, G_AE1, B_AE, respectively. In an embodiment of the inventive concept, the pixel defining film PDL may further include a black material. The pixel defining film PDL may further include a black organic dye/pigment such as carbon black or aniline black. The pixel defining film PDL may be formed by mixing a blue organic material and a black organic material. The pixel defining film PDL may further include a liquid-repellent organic material.

As shown in FIG. 14A, the display panel DP may include first to third emission areas PXA-R, PXA-G, and PXA-B and first to third non-emission areas NPXA-R, NPXA-G, and NPXA-B adjacent to the first to third emission areas PXA-R, PXA-G, and PXA-B. The non-emission area NPXA-R, NPXA-G, and NPXA-B may enclose corresponding emission areas PXA-R, PXA-G, and PXA-B. In the present embodiment, the first emission area PXA-R is defined to correspond to a partial area of the red anode electrode R_AE exposed by the first opening part OP1. The second emission area PXA-G is defined to correspond to a partial area of the green anode electrode G1_AE exposed by the second opening part OP2. The third emission area PXA-B is defined to correspond to a partial area of the blue anode electrode B_AE exposed by the third opening part OP3. A non-pixel area NPA may be defined between the first to third non-emission areas NPXA-R, NPXA-G, and NPXA-B.

A light emitting layer may be disposed on the first electrode layer. The light emitting layer may include red, green, and blue light emitting layers R_EL, G1_EL, and B_EL. The red, green, and blue light emitting layers R_EL, G1_EL, and B_EL may be disposed in areas corresponding to the first to third opening parts OP1, OP2, and OP3, respectively. The red, green, and blue light emitting layers R_EL, G1_EL, and B_EL may be separately formed in the red, green, and blue pixels PXR, PXG1, and PXB (refer to FIG. 4A). Each of the red, green, and blue light emitting layers R_EL, G1_EL, and B_EL may include an organic material and/or an inorganic material. The red, green, and blue light emitting layers R_EL, G1_EL, and B_EL may generate a predetermined color light. For example, the red light emitting layer R_EL may generate red light, the green light emitting layer G1_EL may generate green light, and the blue light emitting layer B_EL may generate blue light.

Although the patterned red, green and blue light emitting layers R_EL, G1_EL, and B_EL are illustrated in this embodiment as an example, one light emitting layer may be commonly disposed in the first to third emission areas PXA-R, PXA-G, and PXA-B. In this case, the light emitting layer may generate white light or blue light. In addition, the light emitting layer may have a multi-layered structure called tandem.

Each of the red, green, and blue light emitting layers R_EL, G1_EL, and B_EL may include a low molecular weight organic material or a high molecular weight organic material as a light emitting material. Alternatively, each of the red, green, and blue light emitting layers R_EL, G1_EL, and B_EL may include a quantum dot material as a light emitting material. The core of the quantum dot may be selected from a group II-VI compound, a group III-V compound, a group IV-VI compound, a group IV element, a group IV compound, and combinations thereof.

A second electrode layer is disposed on the light emitting layer. The second electrode layer may include red, green, and blue cathode electrodes R_CE, G1_CE, and B_CE. The red, green, and blue cathode electrodes R_CE, G1_CE, and B_CE may be electrically connected to each other. As an example of the inventive concept, the red, green, and blue cathode electrodes R_CE, G1_CE, and B_CE may have an integral shape with each other. In this case, the red, green, and blue cathode electrodes R_CE, G1_CE, and B_CE may be commonly disposed in the first to third emission areas PXA-R, PXA-G, and PXA-B, the first to third non-emission areas NPXA-R, NPXA-G, and NPXA-B, and the non-pixel area NPA.

The element layer DP_ED may further include light detection elements OPD1 and OPD2 (see FIG. 4A). Each of the light detection elements OPD1 and OPD2 may be a photodiode. The pixel defining film PDL may further include a fourth opening part OP4 provided to correspond to the light detection elements OPD1 and OPD2.

The first light detection element OPD1 may include a first anode electrode O_E1, a first photoelectric conversion layer O_RL1, and a first cathode electrode O_CE1. The first anode electrode O_E1 may be disposed on the same layer as the first electrode layer. For example, the first anode electrode O_E1 may be disposed on the circuit layer DP_CL, and may be simultaneously formed through the same process as the red, green, and blue anode electrodes R_AE, G1_AE, and B_AE.

The fourth opening part OP4 of the pixel defining film PDL exposes at least a portion of the first anode electrode O_E1. The first photoelectric conversion layer O_RL1 is disposed on the first anode electrode O_E1 exposed by the fourth opening part OP4. The first photoelectric conversion layer O_RL1 may include an organic photo-sensing material. The first cathode electrode O_CE1 may be disposed on the first photoelectric conversion layer O_RL1. The first cathode electrode O_CE1 may be simultaneously formed through the same process as the red, green, and blue cathode electrodes R_CE, G1_CE, and B_CE. As an example of the inventive concept, the first cathode electrode O_CE1 may have an integral shape with the red, green, and blue cathode electrodes R_CE, G1_CE, and B_CE.

Each of the first anode electrode O_E1 and the first cathode electrode O_CE1 may receive an electrical signal. The first cathode electrode O_CE1 may receive a signal different from that of the first anode electrode O_AE1. Accordingly, a predetermined electric field may be formed between the first anode electrode O_E1 and the first cathode electrode O_CE1. The first photoelectric conversion layer O_RL1 generates an electrical signal corresponding to light incident on the sensor. The first photoelectric conversion layer O_RL1 may absorb energy of incident light to generate electric charge. For example, the first photoelectric conversion layer O_RL1 may include a light-sensitive semiconductor material.

The electric charge generated in the first photoelectric conversion layer O_RL1 changes the electric field between the first anode electrode O_E1 and the first cathode electrode O_CE1. The amount of charge generated in the first photoelectric conversion layer O_RL1 may vary depending on whether light is incident on the first light detection element OPD1, the amount of light incident on the first light detection element OPD1, and the intensity. Accordingly, an electric field formed between the first anode electrode O_E1 and the first cathode electrode O_CE1 may vary. The first light detection element OPD1 according to the inventive concept may acquire user's fingerprint information through a change in an electric field between the first anode electrode O_AE1 and the first cathode electrode O_CE1.

However, this is illustrated by way of example, and the first light detection element OPD1 may include a phototransistor having the first photoelectric conversion layer O_RL1 as an active layer. In this case, the first light detection element OPD1 may acquire fingerprint information by detecting an amount of current flowing through the phototransistor. The first light detection element OPD1 according to an embodiment of the inventive concept may include various photoelectric conversion elements capable of generating an electrical signal in response to a change in the amount of light, but is not necessarily limited to any one embodiment.

An encapsulation layer TFE is disposed above the element layer DP_ED. The encapsulation layer TFE includes at least an inorganic layer or an organic layer. In an embodiment of the inventive concept, the encapsulation layer TFE may include two inorganic layers and an organic layer disposed therebetween. In an embodiment of the inventive concept, the thin film encapsulation layer may include a plurality of inorganic layers and a plurality of organic layers that are alternately stacked.

The encapsulation inorganic layer protects the red, green and blue light emitting elements ED_R, ED_G1, and ED_B and the first light detection element OPD1 from moisture/oxygen, and the encapsulation organic layer protects the red, green and blue light emitting elements ED_R, ED_G1, ED_B and the first light detection element OPD1 from foreign substances such as dust particles. The encapsulation inorganic layer may include a silicon nitride layer, a silicon oxynitride layer, a silicon oxide layer, a titanium oxide layer, or an aluminum oxide layer, but the embodiment of the inventive concept is not particularly limited thereto. The encapsulation organic layer may include an acryl-based organic layer, and is not particularly limited thereto.

The display device DD includes an input detection layer ISL disposed on the display panel DP and a color filter layer CFL disposed on the input detection layer ISL.

The input detection layer ISL may be directly disposed on the encapsulation layer TFE. The input detection layer ISL includes a first conductive layer ICL1, an insulating layer IL, a second conductive layer ICL2, and a protective layer PL. The first conductive layer ICL1 may be disposed on the encapsulation layer TFE. FIGS. 14A and 14B illustrate a structure in which the first conductive layer ICL1 is directly disposed on the encapsulation layer TFE, but the inventive concept is not necessarily limited thereto. The input detection layer ISL may further include a base insulating layer disposed between the first conductive layer ICL1 and the encapsulation layer TFE. In this case, the encapsulation layer TFE may be covered by the base insulating layer, and the first conductive layer ICL1 may be disposed on the base insulating layer. As an example of the inventive concept, the base insulating layer may include an inorganic insulating material.

The insulating layer IL may cover the first conductive layer ICL1. The second conductive layer ICL2 is disposed on the insulating layer IL. Although the structure in which the input detection layer ISL includes the first and second conductive layers ICL1 and ICL2 is illustrated, the inventive concept is not necessarily limited thereto. For example, the input detection layer ISL may include only one of the first and second conductive layers ICL1 and ICL2.

The protective layer PL may be disposed on the second conductive layer ICL2. The protective layer PL may include an organic insulating material. The protective layer PL may serve to protect the first and second conductive layers ICL1 and ICL2 from moisture/oxygen, and to protect the first and second conductive layers ICL1 and ICL2 from foreign substances.

The color filter layer CFL may be disposed on the input detection layer ISL. The color filter layer CFL may be directly disposed on the protective layer PL. The color filter layer CFL may include a first color filter CF_R, a second color filter CF_G, and a third color filter CF_B. The first color filter CF_R has a first color, the second color filter CF_G has a second color, and the third color filter CF_B has a third color. As an example of the inventive concept, the first color may be red, the second color may be green, and the third color may be blue.

The color filter layer CFL may further include a dummy color filter DCF. As an example of the inventive concept, when an area in which the photoelectric conversion layer ORL is disposed is defined as a sensing area SA, and a periphery of the sensing area SA is defined as a non-sensing area NSA, the dummy color filter DCF may be disposed to correspond to the sensing area SA. The dummy color filter DCF may at least partially overlap the sensing area SA and the non-sensing area NSA. As an example of the inventive concept, the dummy color filter DCF may have the same color as one of the first to third color filters CF_R, CF_G, and CF_B. As an example of the inventive concept, the dummy color filter DCF may have the same green color as the second color filter CF_G.

The color filter layer CFL may further include a black matrix BM. The black matrix BM may be disposed to correspond to the non-pixel area NPA. The black matrix BM may at least partially overlap the first and second conductive layers ICL1 and ICL2 in the non-pixel area NPA. As an example of the inventive concept, the black matrix BM may at least partially overlap the non-pixel area NPA and the first to third non-emission areas NPXA-G, NPXA-B, and NPXA-R. The black matrix BM might not overlap the first to third emission areas PXA-R, PXR-G, and PXA-B.

The color filter layer CFL may further include an overcoat layer OCL. The overcoat layer OCL may include an organic insulating material. The overcoat layer OCL may be provided with a thickness sufficient to remove a step difference between the first to third color filters CF_R, CF_G, and CF_B. The overcoat layer OCL is not particularly limited in terms of size, shape, and material composition as long as it has a predetermined thickness and is a material capable of planarizing the upper surface of the color filter layer CFL, and may include, for example, an acrylate-based organic material.

Referring to FIG. 14B, when the display device DD (refer to FIG. 1) operates, each of the red, green, and blue light emitting elements ED_R, ED_G1, and ED_B may output light. The red light emitting elements ED_R output red light in a red wavelength band, the green light emitting elements ED_G1 output green light in a green wavelength band, and the blue light emitting elements ED_B output blue light in a blue wavelength band.

As an example of the inventive concept, the first light detection element OPD1 may receive light from specific light emitting elements (e.g., green light emitting elements ED_G1) among the red, green and blue light emitting elements ED_R, ED_G1, ED_B. For example, the first light detection element OPD1 may receive the second reflected light Lg2 reflected by the user's fingerprint from the green light Lg1 output from the green light emitting elements ED_G1. The second reflected light Lg2 may be green light in a green wavelength band. The dummy color filter DCF is disposed on the sensors OPD. The dummy color filter DCF may have a green color. Accordingly, the second reflected light Lg2 may pass through the dummy color filter DCF and be incident on the first light detection element OPD1.

The red and blue lights output from the red and blue light emitting elements ED_R and ED_B may also be reflected by the user's hand US_F. For example, when the red light Lr1 output from the red light emitting elements ED_R defines the light reflected by the user's hand US_F as the first reflected light Lr2, the first reflected light Lr2 might not pass through the dummy color filter DCF and be absorbed. Accordingly, the first reflected light Lr2 does not pass through the dummy color filter DCF and cannot be incident on the first light detection element OPD1. Likewise, even if blue light is reflected by the user's hand US_F, it may be absorbed by the dummy color filter DCF. Accordingly, only the second reflected light Lg2 may be provided to the first light detection element OPD1.

According to an embodiment of the inventive concept, by increasing the number of light detection elements provided in the display panel, the overall amount of light received by the sensor in the display panel may be increased, and as a result, the sensing performance of the sensor may be increased.

In addition, when the shape of the anode electrode of each of the first and second green light emitting elements is different, by preventing or removing a luminance deviation generated between the first and second green light emitting elements, the overall image quality of the display device may be increased.

Although various embodiments of the inventive concept have been described, it is understood that the inventive concept is not necessarily limited to these embodiments but various changes and modifications may be made by one ordinary skilled in the art within the spirit and scope of the present disclosure.

What is claimed is:

1. A display device, comprising:
   a base layer; and
   a pixel layer disposed on the base layer and including a plurality of reference pixel units and a plurality of sensors,
   wherein each of the plurality of reference pixel units comprises first and second light emitting elements emitting a first color light,
   wherein each of the plurality of sensors comprises:
      at least one light detection element corresponding to one of the plurality of reference pixel units; and
      a sensor driving circuit electrically connected to the at least one light detection element,
   wherein each of the first and second light emitting elements comprises:
      an anode electrode; and
      a light emitting layer disposed on the anode electrode,
   wherein the light emitting layer of the first light emitting element has a same size as the light emitting layer of the second light emitting element, and
   wherein the anode electrode of the first light emitting element has a size that is different from that of the anode electrode of the second light emitting element.

2. The display device of claim 1, wherein the first and second light emitting elements are alternately disposed in a first direction and a second direction orthogonal to the first direction.

3. The display device of claim 2, wherein one of the first and second light emitting elements at least partially overlaps the sensor driving circuit, and
   wherein the other of the first and second light emitting elements does not overlap the sensor driving circuit.

4. The display device of claim 1, wherein each of the plurality of reference pixel units comprises:
   a first pixel driving circuit electrically connected to the first light emitting element; and a second pixel driving circuit electrically connected to the second light emitting element, wherein each of the first and second pixel driving circuits comprises:

a first transistor electrically connected between a first driving voltage line receiving a first driving voltage and a corresponding light emitting element; and a second transistor electrically connected between a data line and the first transistor.

5. The display device of claim 4, wherein a gate electrode of the first transistor of the first pixel driving circuit at least partially overlaps the anode electrode of the first light emitting element to form a first overlapping area, and wherein the gate electrode of the first transistor of the second pixel driving circuit at least partially overlaps the anode electrode of the second light emitting element to form a second overlapping area.

6. The display device of claim 5, wherein the first overlapping area is equal in size to the second overlapping area.

7. The display device of claim 4, wherein each of the plurality of reference pixel units further comprises:

a third light emitting element configured to output a second color light that is different from the first color light; and a fourth light emitting element configured to output a third color light that is different from each of the first and second color lights, wherein the light detection element is disposed between the first and second light emitting elements in a first direction, and is disposed between the third and fourth light emitting elements in a second direction intersecting the first direction.

8. The display device of claim 7, wherein each of the plurality of reference pixel units further comprises:

a third pixel driving circuit electrically connected to the third light emitting element; and a fourth pixel driving circuit electrically connected to the fourth light emitting element, wherein the sensor driving circuit is disposed between the first pixel driving circuit and the fourth pixel driving circuit in the first direction.

9. The display device of claim 7, wherein a light emitting layer of the fourth light emitting element has a same shape as a light emitting layer of the third light emitting element and has a larger size than the light emitting layer of the third light emitting element, wherein the light emitting layer of each of the third and fourth light emitting elements has an octagonal shape that is longer in the first direction than in the second direction, and wherein the light emitting layer of each of the first and second light emitting elements has an octagonal shape that is longer in the second direction than in the first direction.

10. The display device of claim 9, wherein the light emitting layer of each of the first and second light emitting elements has first and second sides extending in the first direction, third and fourth sides extending in the second direction, and first to fourth inclined sides inclined with respect to the first and second directions, and wherein lengths of the first and second sides are shorter than lengths of the third and fourth sides.

11. The display device of claim 10, wherein in the light emitting layer of the first light emitting element, among the first to fourth inclined sides, the first and fourth inclined sides facing each other have a shorter length than the second and third inclined sides facing each other, and wherein in the light emitting layer of the second light emitting element, among the first to fourth inclined sides, the first and fourth inclined sides facing each other have a longer length than the second and third inclined sides facing each other.

12. The display device of claim 10, wherein the light emitting layer of each of the third and fourth light emitting elements has first and second sides extending in the first direction, third and fourth sides extending in the second direction, and first to fourth inclined sides inclined with respect to the first and second directions, and wherein lengths of the first and second sides are longer than lengths of the third and fourth sides.

13. The display device of claim 12, wherein the first inclined side of the first light emitting element and the fourth inclined side of the third light emitting element are spaced apart by a first interval, wherein the fourth inclined side of the first light emitting element and the first inclined side of the third light emitting element are spaced apart by a second interval, wherein the second inclined side of the first light emitting element and the third inclined side of the fourth light emitting element are spaced apart by a third interval, and wherein the third inclined side of the first light emitting element and the third inclined side of the fourth light emitting element are spaced apart by a fourth interval.

14. The display device of claim 13, wherein the first to fourth intervals are equal to each other.

15. The display device of claim 1, wherein each of the plurality of sensors comprises k light detection elements electrically connected in parallel to the sensor driving circuit, wherein the sensor driving circuit is electrically connected to one light detection element among the k number of light detection elements, and where k is an integer greater than or equal to 2.

16. The display device of claim 15, wherein each of the k light detection elements comprises:

a sensing anode electrode; and a photoelectric conversion layer disposed on the sensing anode electrode, wherein the sensor driving circuit is directly connected to the sensing anode electrode of the one light detection element.

17. The display device of claim 15, wherein each of the plurality of sensors further comprises a routing wire electrically connecting the k light detection elements to each other.

18. The display device of claim 15, wherein the k light detection elements have a same shape as each other, and wherein each of the k light detection elements has a shape that is different from that of the first and second light emitting elements.

19. An electronic device, comprising:

a display device, comprising:

a base layer; and a pixel layer disposed on the base layer and including a plurality of pixels and a plurality of sensors, wherein each of the plurality of sensors comprises:

k light detection elements electrically connected to each other; and a sensor driving circuit electrically connected to one of the k light detection elements, wherein a first light emitting element at least partially overlapping the sensor driving circuit, among the plurality of pixels, comprises a first anode electrode, wherein a second light emitting element that does not overlap the sensor driving circuit, among the plurality of pixels, and outputs a same color light as the first light emitting element comprises a second anode electrode, and wherein the first anode electrode has a shape that is different from that of the second anode electrode.

20. The display electronic device of claim 19, wherein the plurality of pixels comprise:

a first pixel driving circuit electrically connected to the first light emitting element; and a second pixel driving circuit electrically connected to the second light emitting element, wherein each of the first and second pixel driving circuits comprises:

a first transistor electrically connected between a first driving voltage line receiving a first driving voltage and a corresponding light emitting element; and a second transistor electrically connected between a data line and the first transistor.

21. The electronic device of claim 20, wherein a gate electrode of the first transistor of the first pixel driving circuit at least partially overlaps the first anode electrode of the first light emitting forming to form a first overlapping area, and wherein a gate electrode of the first transistor of the second pixel driving circuit at least partially overlaps the second anode electrode of the second light emitting element to form a second overlapping area.

22. The electronic device of claim 21, wherein the first overlapping area is equal in size to the second overlapping area.

23. The electronic device of claim 19, wherein the first light emitting element further comprises a first light emitting layer disposed on the first anode electrode, wherein the second light emitting element further comprises a second light emitting layer disposed on the second anode electrode, wherein each of the first and second light emitting layers comprises first and second sides extending in a first direction, third and fourth sides extending in a second direction orthogonal to the first direction, and first to fourth inclined sides inclined with respect to the first and second directions, and wherein lengths of the first and second sides are shorter than lengths of the third and fourth sides.

24. The electronic device of claim 23, wherein among the first to fourth inclined sides of the first light emitting layer, the first and fourth inclined sides facing each other have a longer length than the second and third inclined sides facing each other, and wherein among the first to fourth inclined sides of the second light emitting layer, the first and fourth inclined sides facing each other have a shorter length than the second and third inclined sides facing each other.

25. The electronic device of claim 19, wherein the first light emitting element is spaced apart by a first interval from a third light emitting element that outputs a color light that is different from that of the first light emitting element, wherein the first light emitting element is spaced apart by a second interval from a fourth light emitting element that outputs a color light different from that of the first and third light emitting elements, and wherein the first interval is equal in size to the second interval.

26. The electronic device of claim 25, wherein each of the k light detection elements is disposed between the first and second light emitting elements in a first direction, and disposed between the third and fourth light emitting elements in a second direction intersecting the first direction.

27. The electronic device of claim 26, wherein in the second direction, an interval between each of the k light detection elements and the third light emitting element is equal in size to an interval between each of the k light detection elements and the fourth light emitting element.

* * * * *